US012640695B2

(12) United States Patent
Lehtola

(10) Patent No.: US 12,640,695 B2
(45) Date of Patent: May 26, 2026

(54) HIGH EFFICIENCY POWER AMPLIFIER

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 393 days.

(21) Appl. No.: 18/141,922

(22) Filed: May 1, 2023

(65) Prior Publication Data

US 2023/0361732 A1 Nov. 9, 2023

Related U.S. Application Data

(60) Provisional application No. 63/337,163, filed on May 1, 2022, provisional application No. 63/337,160, filed on May 1, 2022, provisional application No. 63/337,161, filed on May 1, 2022, provisional application No. 63/337,162, filed on May 1, 2022.

(51) Int. Cl.
| | |
|---|---|
| *H03F 3/191* | (2006.01) |
| *H03F 1/02* | (2006.01) |
| *H03F 3/24* | (2006.01) |
| *H03F 3/26* | (2006.01) |

(52) U.S. Cl.
CPC ........... *H03F 3/245* (2013.01); *H03F 1/0222* (2013.01); *H03F 3/26* (2013.01); *H03F 2200/451* (2013.01)

(58) Field of Classification Search
CPC ........................................................ H03F 3/191
USPC ................................................ 330/302, 305
See application file for complete search history.

(56) References Cited

U.S. PATENT DOCUMENTS

| | | | | |
|---|---|---|---|---|
| 4,107,619 A | * | 8/1978 | Pass ...................... | H03F 3/3072 |
| | | | | 330/261 |
| 5,446,412 A | * | 8/1995 | Kimyacioglu ........ | H03F 3/3001 |
| | | | | 330/261 |
| 5,798,660 A | * | 8/1998 | Cheng ................. | H03F 3/45192 |
| | | | | 327/563 |
| 9,112,463 B2 | * | 8/2015 | Jeon ........................ | H03F 3/191 |
| 2014/0191801 A1 | | 7/2014 | Wilson et al. | |
| 2020/0350879 A1 | | 11/2020 | Broughton et al. | |

(Continued)

FOREIGN PATENT DOCUMENTS

WO WO2005027342 A1 3/2005

OTHER PUBLICATIONS

International Search Report dated Jun. 17, 2024 for PCT/US2023/075259.
Written Opinion dated Jun. 17, 2024 for PCT/US2023/075259.

*Primary Examiner* — Henry Choe
(74) *Attorney, Agent, or Firm* — Chang & Hale LLP

(57) ABSTRACT

In some embodiments, a power amplifier circuit can include a power amplifier having an input node and an output node, and a load modulation circuit coupled to the output node of the power amplifier. The power amplifier circuit can further include a control profile configured to provide information for generating a control signal for the load modulation circuit, and a control circuit configured to generate and provide the control signal to the load modulation circuit based on the control profile. In some embodiments, the control profile can be further configured to provide information for generating a control signal for a phase compensation circuit.

18 Claims, 34 Drawing Sheets

(56)　　　　　References Cited

U.S. PATENT DOCUMENTS

| 2021/0351746 A1 | 11/2021 | Ghannouchi |
| 2022/0189936 A1 | 6/2022 | Murata |

* cited by examiner

STEP 1: OPTIMIZE LOAD AT MIN/MAX LM CAPACITANCE
STEP 2: OPTIMIZE AT C_MIN
STEP 3: OBTAIN AMAM CONTROL PROFILE

STEP 4: OBTAIN PHASE COMPENSATION CONTROL PROFILE

VCTRL_AMPM AC RESPONSE

288 MHz m2
FREQ=288.4MHz
dB(VCTRL_−expand)dB(VCTRL[0]))=−3.048
doelter=16,  temp=85.000,  ISAT_DET=0.100 freq, Hz

STEP 5: IMPLEMENT PHASE COMPENSATION AND VERIFY APT PERFORMANCE

HIGH EFFICIENCY POWER AMPLIFIER

CROSS-REFERENCE TO RELATED APPLICATION(S)

This application claims priority to U.S. Provisional Application Nos. 63/337,163 filed May 1, 2022, entitled HIGH EFFICIENCY POWER AMPLIFIER, 63/337,160 filed May 1, 2022, entitled LOAD MODULATOR WITH VARIABLE CAPACITANCE, 63/337,161 filed May 1, 2022, entitled WIDE BANDWIDTH PHASE COMPENSATION FOR POWER AMPLIFIER, and 63/337,162 filed May 1, 2022, entitled INTEGRATED COMPENSATION OF AMPLITUDE AND PHASE DISTORTIONS, the disclosure of each of which is hereby expressly incorporated by reference herein in its respective entirety.

BACKGROUND

Field

The present disclosure relates to amplifiers for radio-frequency (RF) applications.

Description of the Related Art

In electronic applications such as radio-frequency (RF) applications, signals can be amplified for a number of reasons. For example, an RF signal to be transmitted can be amplified by a power amplifier, and such an amplified signal can be routed to an antenna for transmission.

SUMMARY

In accordance with a number of implementations, the present disclosure relates to a power amplifier circuit that includes a power amplifier having an input node and an output node, a load modulation circuit coupled to the output node of the power amplifier, and a control profile configured to provide information for generating a control signal for the load modulation circuit. The power amplifier circuit further includes a control circuit configured to generate and provide the control signal to the load modulation circuit based on the control profile.

In some embodiments, the control signal can be generated based on a first current representative of a tunable reference current and a second current representative of a saturation detection current. The first current can include an AMAM current.

In some embodiments, the power amplifier circuit can further include a phase compensation circuit implemented in the input node side of the power amplifier. The control profile can be further configured to provide information for generating a control signal for the phase compensation circuit. The control signal for the phase compensation circuit can be based on a third current representative of a tunable reference current and the second current. The third current can include an AMPM current.

In some embodiments, the load modulation circuit can be configured to provide variable capacitance that depends on a control voltage representative of the control signal. The information provided by the control profile can include an optimized load at a minimum capacitance of the variable capacitance and an optimized load at a maximum capacitance of the variable capacitance.

The information provided by the control profile can further include an optimized bias configuration for the power amplifier.

The information provided by the control profile can further include an AMAM control profile for the generation of the control signal.

The information provided by the control profile can further include a phase compensation profile for generation of a control signal for a phase compensation circuit.

The information provided by the control profile can further include average power tracking performance information based on implementation of the control signal for the phase compensation circuit.

In some embodiments, the power amplifier can include an input stage and an output stage. The input stage can be implemented as a driver stage, and the output stage can be implemented as a final stage. The driver stage can be implemented as a cascode driver stage. The cascode driver stage can be configured to operate with a Class AB bias.

In some embodiments, the final stage can be implemented as a push-pull amplifier. The push-pull amplifier can include a splitter having an input and a pair of outputs, with each output being coupled to an input of a respective amplifier. The push-pull amplifier can further include a combining circuit that combines outputs of the pair of amplifiers. Each of the pair of amplifiers can be configured to operate with a Class AB bias. The combining circuit can include a transformer circuit having a primary with first and second nodes coupled to the outputs of the pair of amplifiers, and a secondary with first and second nodes, with the first node being coupled to an output node and the second node being coupled to ground through the load modulator.

In some implementations, the present disclosure relates to a method for operating a power amplifier. The method includes receiving a signal at an input node, amplifying the signal, and providing load modulation for the amplified signal by generating a control signal based on a control profile having information for the generation of the control signal.

In some embodiments, the load modulation can include a variable capacitance that depends on a control voltage representative of the control signal.

The information provided by the control profile can include an optimized load at a minimum capacitance of the variable capacitance and an optimized load at a maximum capacitance of the variable capacitance.

The information provided by the control profile can further include an optimized bias configuration for the power amplifier.

The information provided by the control profile can further include an AMAM control profile for the generation of the control signal.

The information provided by the control profile can further include a phase compensation profile for generation of a control signal for a phase compensation circuit.

The information provided by the control profile can further include average power tracking performance information based on implementation of the control signal for the phase compensation circuit.

In some implementations, the present disclosure relates to a semiconductor die that includes a substrate and a power amplifier circuit implemented on the substrate. The power amplifier circuit includes a power amplifier having an input node and an output node, a load modulation circuit coupled to the output node of the power amplifier, and a control profile configured to provide information for generating a control signal for the load modulation circuit. The power amplifier circuit further includes a control circuit configured to generate and provide the control signal to the load modulation circuit based on the control profile.

In some embodiments, the control profile can be further configured to provide information for generating a control signal for a phase compensation circuit.

In some embodiments, the substrate can be configured to support heterojunction bipolar transistors.

In some implementations, the present disclosure relates to a packaged module that includes a packaging substrate and a power amplifier circuit implemented on the packaging substrate. The power amplifier circuit includes a power amplifier having an input node and an output node, a load modulation circuit coupled to the output node of the power amplifier, and a control profile configured to provide information for generating a control signal for the load modulation circuit. The power amplifier circuit further includes a control circuit configured to generate and provide the control signal to the load modulation circuit based on the control profile.

In some embodiments, the control profile can be further configured to provide information for generating a control signal for a phase compensation circuit.

In some embodiments, the power amplifier circuit can be implemented on a single semiconductor die. In some embodiments, the packaged module can be implemented as a power amplifier module.

In some implementations, the present disclosure relates to a wireless device that includes an antenna and an amplifier circuit configured to amplify a radio-frequency signal associated with the antenna. The amplifier circuit includes an amplifier, a load modulation circuit coupled to an output node of the amplifier, and a control profile configured to provide information for generating a control signal for the load modulation circuit. The amplifier circuit further includes a control circuit configured to generate and provide the control signal to the load modulation circuit based on the control profile.

In some embodiments, the control profile can be further configured to provide information for generating a control signal for a phase compensation circuit.

In some embodiments, the amplifier circuit can be implemented as a power amplifier circuit. The antenna can be configured to support a transmit operation of the amplified radio-frequency signal provided by the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 15 further shows loop phase and phase margin plots for different temperatures.

DETAILED DESCRIPTION OF SOME EMBODIMENTS

The headings provided herein, if any, are for convenience only and do not necessarily affect the scope or meaning of the claimed invention.

Figure 1:
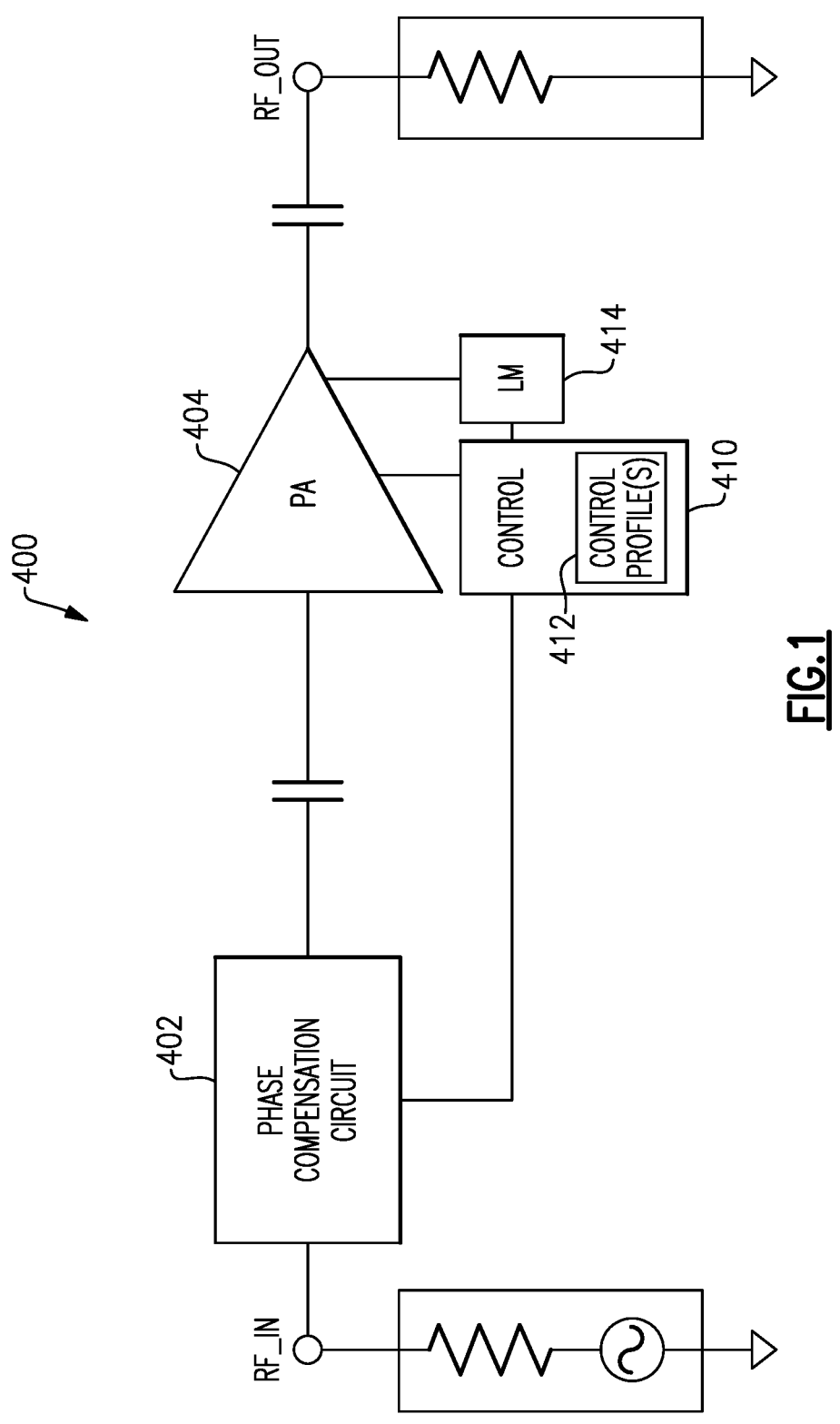
FIG. 1 shows a power amplifier system configured to receive a signal as an input and amplify the signal with a power amplifier.

Described herein are examples related to high efficiency power amplifiers. FIG. 1 shows a power amplifier system 400 configured to receive a signal as an input (RF_IN) and amplify the signal with a power amplifier 404. The amplified signal can then be provided as an output (RF_OUT). As described herein, the power amplifier system 400 may also be referred to as a power amplifier circuit, or simply as a power amplifier.

FIG. 1 shows that in some embodiments, the power amplifier system 400 can include a load modulation (LM) circuit 414. Such a load modulation circuit (also referred to herein as a load modulator) can be coupled to an output side of the power amplifier 404.

Although various examples are described herein in the context of power amplifiers, it will be understood that in some embodiments, one or more features of the present disclosure can also be utilized for other types of amplifiers.

FIG. 1 shows that in some embodiments, the power amplifier system 400 can also include a phase compensation circuit 402 implemented on the input side of the power amplifier 404. For example, the phase compensation circuit 402 can be implemented between the input RF_IN and a DC-blocking capacitance on the input side of the power amplifier 404.

Referring to FIG. 1, the power amplifier system 400 can include a control circuit 410 configured to control the load modulator 414 and the phase compensation circuit 402. In some embodiments, the control circuit 410 can include or have access to one or more control profiles 412 for operation of either or both of the load modulator 414 and the phase compensation circuit 402.

Figure 2:
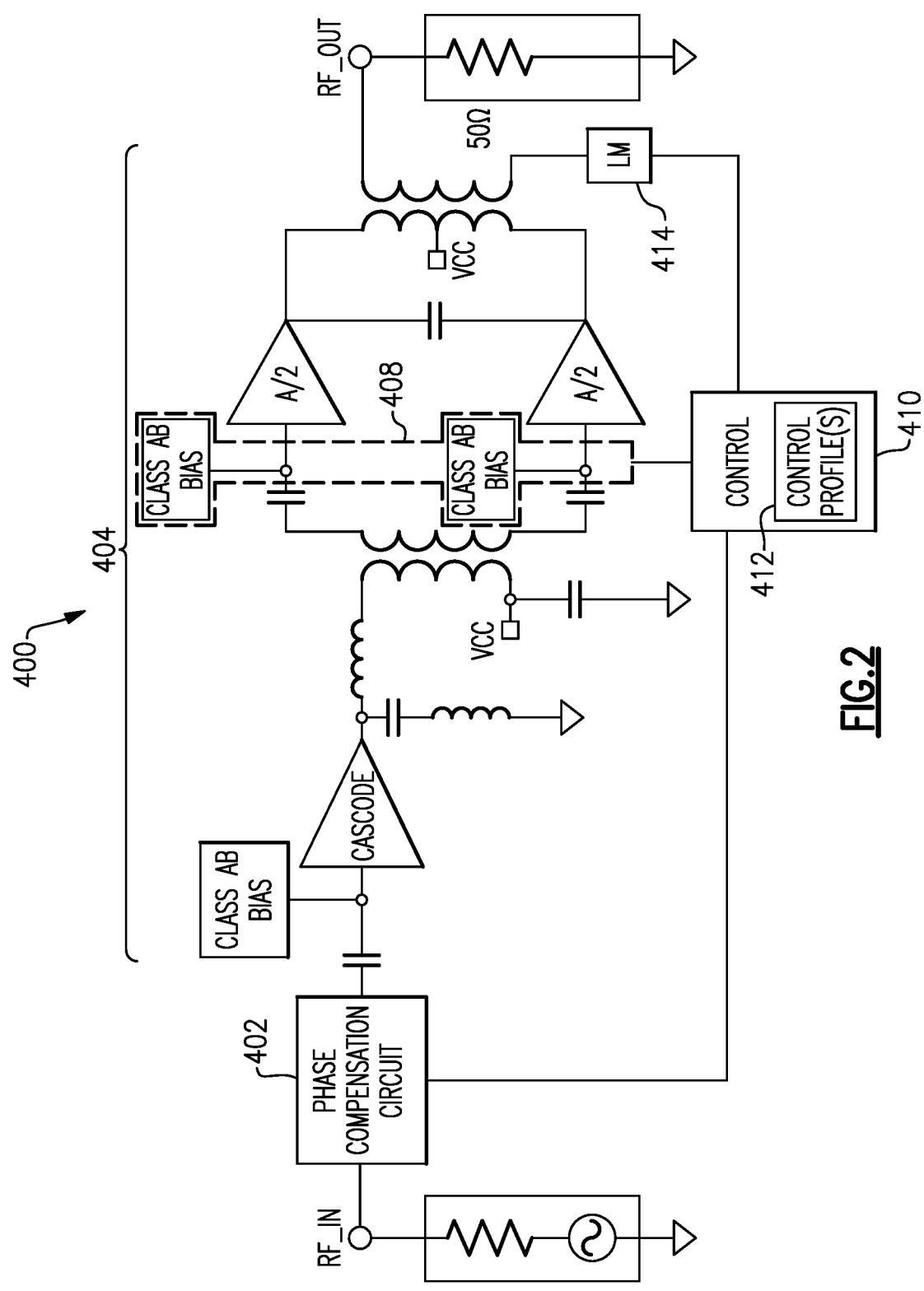
FIG. 2 shows that in some embodiments, the power amplifier of FIG. 1 can be implemented as a power amplifier having a push pull architecture.

FIG. 2 shows that in some embodiments, the power amplifier 404 of FIG. 1 can be implemented as a power amplifier having a push-pull architecture. In the example of FIG. 2, the power amplifier 404 is shown to include a cascode driver stage and an inverse F push-pull final stage. In some embodiments, a load modulator (LM) 414 is shown to be coupled to a secondary of an output combining/matching balun circuit 415 combines the outputs of two amplifiers (each indicated as A/2 in FIG. 2) of the push-pull final stage.

In the example of FIG. 2, the load modulator 414 is shown to be controlled by the control circuit 410. In some embodiments, the control circuit 410 of FIGS. 1 and 2 can be based on the control profile(s) 412 as described herein to control the load modulator 414.

In the example of FIG. 2, each of the cascode driver stage and the push-pull final stage is depicted as being provided with Class AB bias. However, it will be understood that one or more features of the present disclosure can also be implemented in power amplifiers having different bias configurations.

FIG. 2 shows that in some embodiments, a phase compensation circuit 404 having one or more features as described herein can be implemented between on the input side of the cascode driver stage, and be controlled by the control circuit 410. In some embodiments, the control circuit 410 of FIGS. 1 and 2 can be based on the control profile(s) 412 as described herein to control the phase compensation circuit 402.

Additional details and examples of the load modulator 414 of FIGS. 1 and 2 are provided in the herein-referenced U.S. Provisional Application No. 63/337,160 which is hereby expressly incorporated by reference herein in its entirety. Additional details and examples of the phase compensation circuit 402 of FIGS. 1 and 2 are provided in the herein-referenced U.S. Provisional Application No. 63/337, 161 which is hereby expressly incorporated by reference herein in its entirety.

Figure 3:
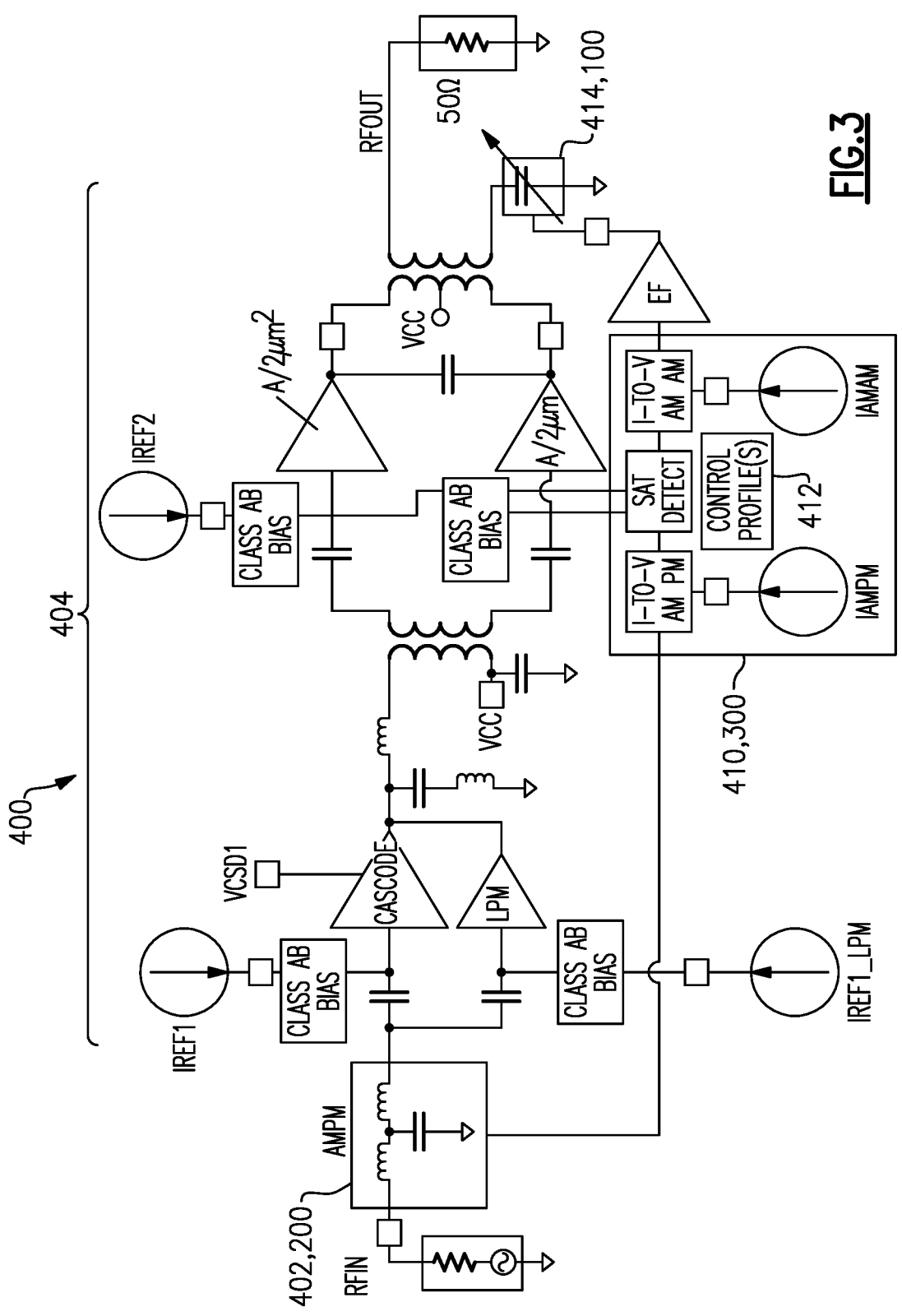
FIG. 3 shows an example where the power amplifier system of FIG. 2 includes a control circuit that generates a control voltage for a load modulator and a control voltage for a phase compensation circuit.

FIG. 3 shows an example where the power amplifier system 400 of FIG. 2 includes a control circuit 410 that generates a control voltage for the load modulator 414 based on a current IAMAM and saturation detection, and a control voltage for the phase compensation circuit 402 based on a current IAMPM and the saturation detection. Additional details and examples of such generation of control voltages based on respective currents and the saturation detection are provided in the herein-referenced U.S. Provisional Application No. 63/337,162 which is hereby expressly incorporated by reference herein in its entirety, where the control circuit 410 may be referenced as 300, the load modulator 414 may be referenced as 100, and the phase compensation circuit 402 may be referenced as 200.

In the example of FIG. 3, the driver stage that includes the cascode amplifier is also shown to include a low-power mode (LPM) amplifier in parallel with the cascode amplifier. Such a low-power mode amplifier can be enabled (and the cascode amplifier disabled) when the input power is below some level. It will be understood that a power amplifier having one or more features as described herein may or may not include such a low-power mode amplifier.

Figure 4:
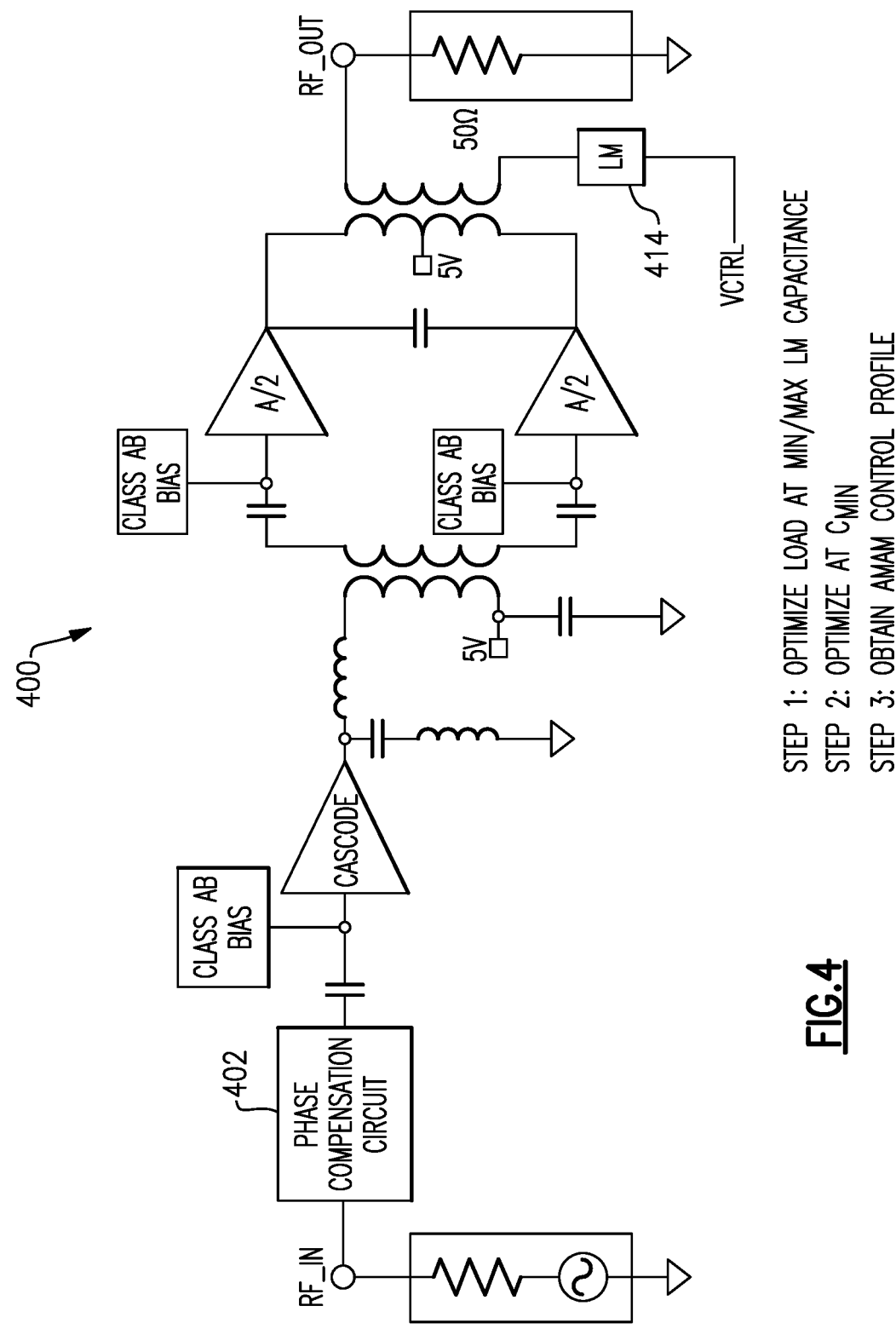
FIG. 4 shows examples of steps that can be implemented to provide desired control for the power amplifier system of FIG. 2.

Described herein are examples of steps that can be utilized to design a high efficiency power amplifier. Referring to FIG. 4, such steps can include a step (Step 1) where loads at minimum and maximum load modulation (LM) capacitances are optimized.

For example, and as described in U.S. Provisional Application No. 63/337,160, suppose that the load modulator provides a linear relationship between the capacitance C of the load modulator and the control voltage VCTRL range of 1.0V to 2.5V. Then, the minimum capacitance $C_{MIN}$ can be selected to be the capacitance C when the load modulator is provided with VCTRL=1.0V, and the maximum capacitance $C_{MAX}$ can be selected to be the capacitance C when the load modulator is provided with VCTRL=2.5V.

Referring to FIG. 4 where 5V is provided to the combiner 415, UHB PSAT at $C_{MAX}$ can be calculated to be 28.7 dBm+2 dB+4.5 dB=35.2 dBm, and UHB PSAT at $C_{MIN}$ can be calculated to be less than or equal to 35.2 dBm−4 dB=31.2 dBm.

Referring to FIG. 4, Step 2 can include optimization of bias at $C_{MIN}$ (e.g., by setting VCTRL to 1.0V). Such an optimization can include a landing zone that is linear or approximately linear, and an ACLR plateau below −40 dBc can be targeted. Such a step effectively sets an ACLR plateau of the entire load modulated push-pull amplifier of FIG. 4.

Referring to FIG. 4, Step 3 can include obtaining of a desired AMAM control profile for controlling of the load modulator 414. Such an AMAM control profile can be obtained by running waterfalls with bias and load configurations of Steps 1 and 2. For example, VCTRL can be varied in 50 mV steps between the example range of 1.0V to 2.5V. In some embodiments, a control circuit can be designed or configured to provide AMAM control based on ISOGAIN VCTRL vs VB2 profile, similar to the example described in U.S. Provisional Application No. 63/337,162.

Figure 5:
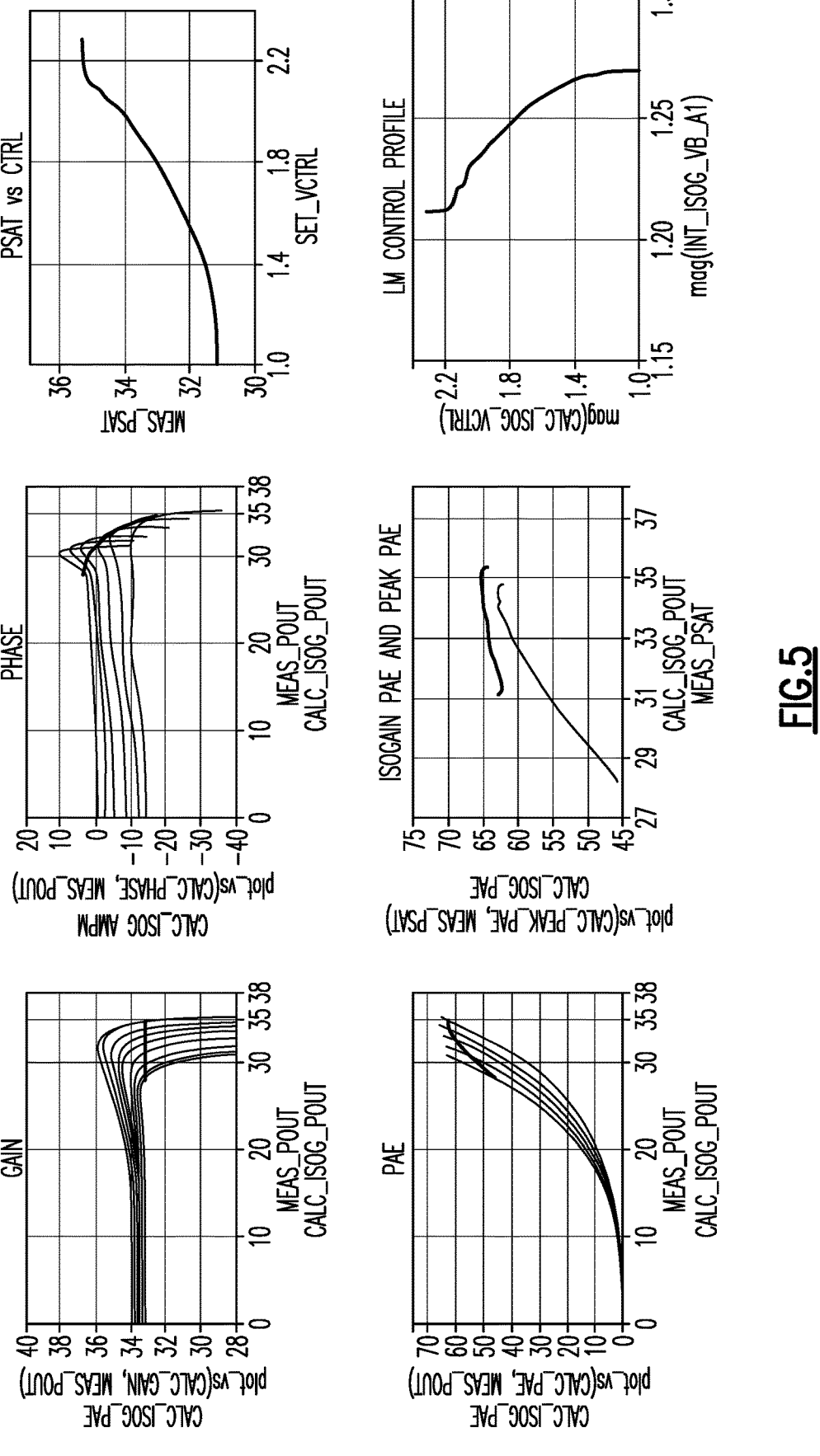
FIG. 5 shows various plots related to one of the steps of FIG. 4.

FIG. 5 shows various plots related to the ISOGAIN characteristic in the foregoing Step 3.

Figure 6:
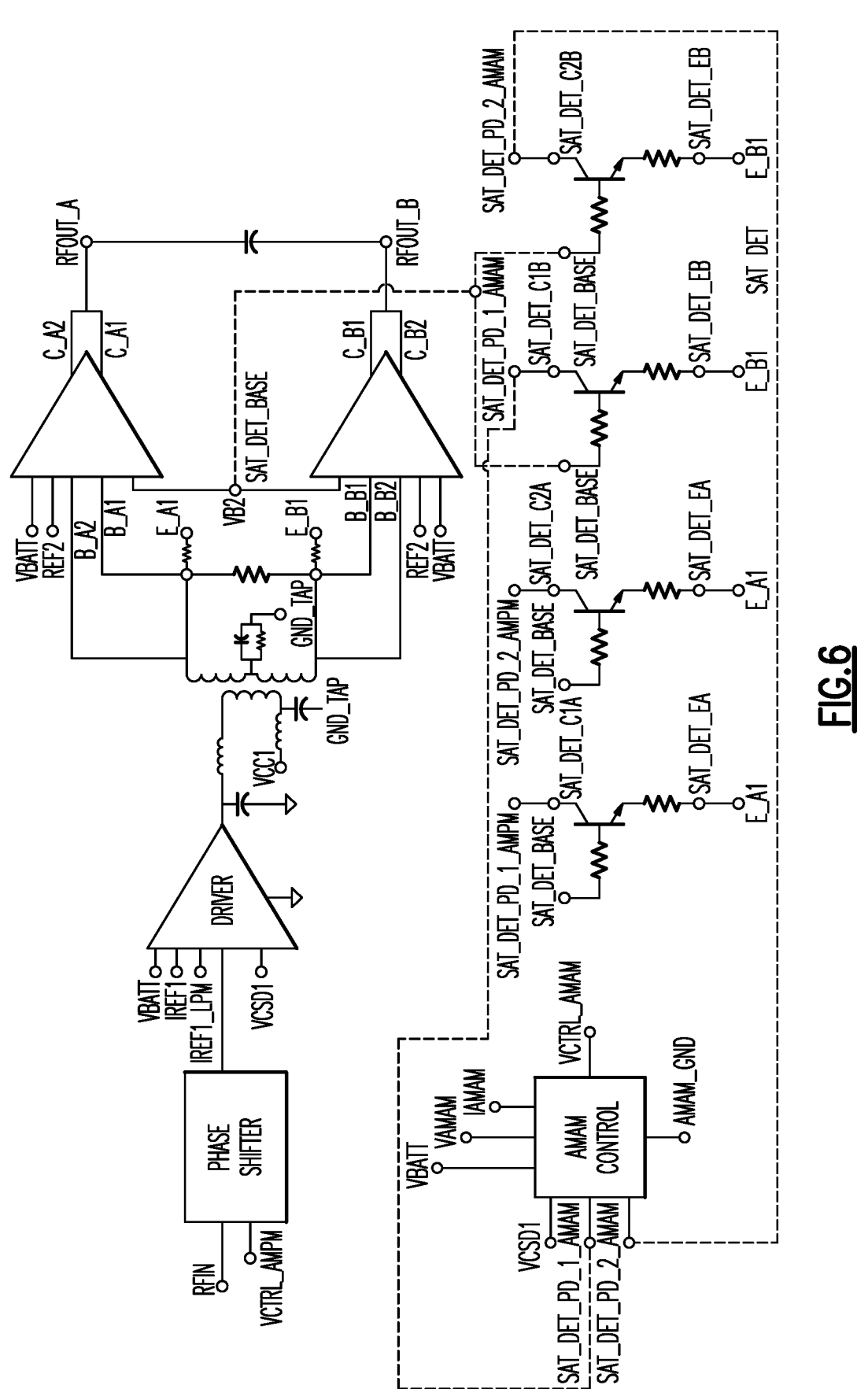
FIG. 6 depicts an example of how AMAM control with the control circuit of FIG. 3 can be implemented.

FIG. 6 depicts an example of how AMAM control with the control circuit 410, 300 of FIG. 3 can be implemented, as described in U.S. Provisional Application No. 63/337, 162.

Figure 7:
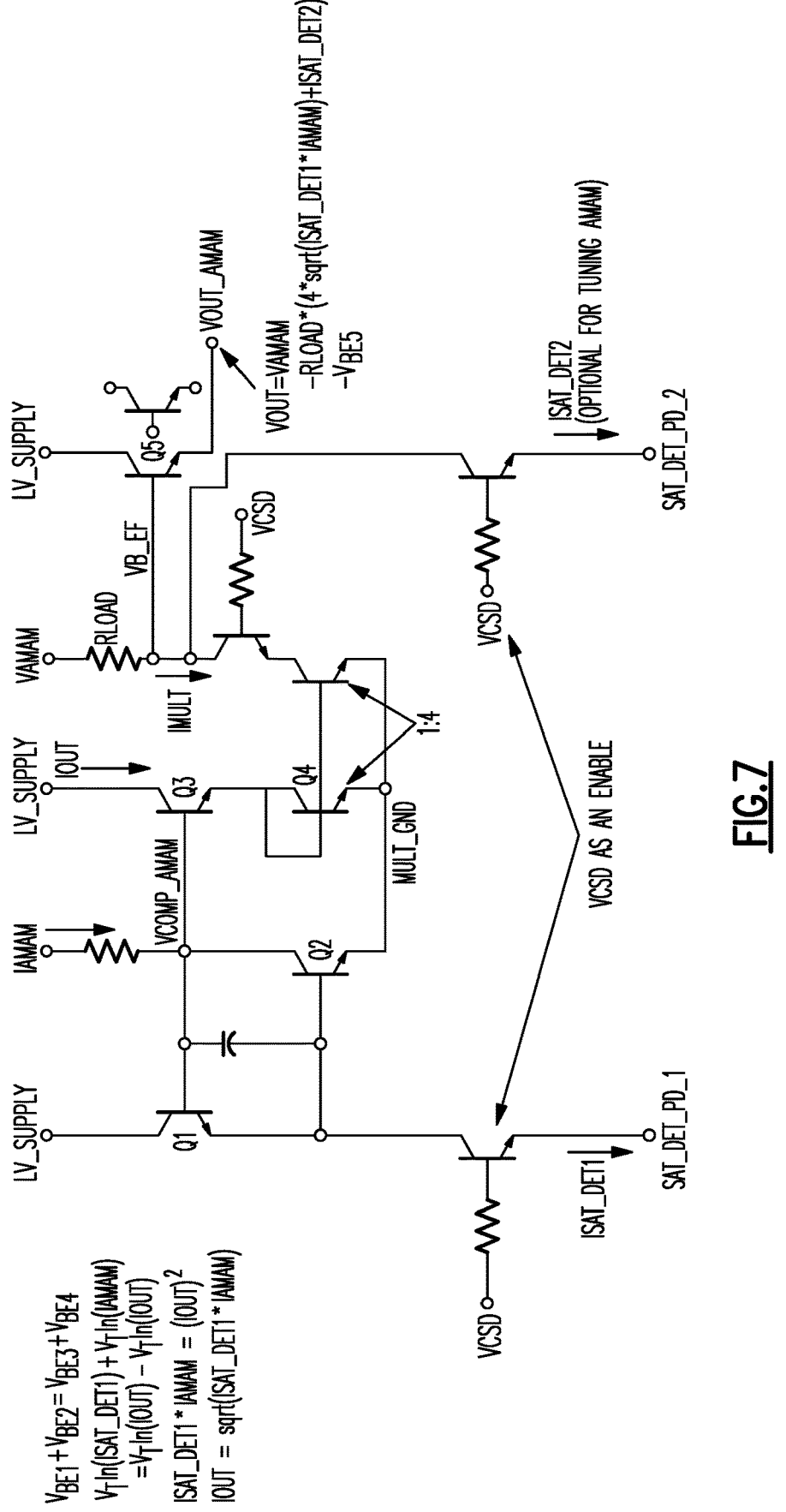
FIG. 7 shows an example of how control signal can be generated by the control circuit of FIG. 3.

FIG. 7 shows an example of how the control signal VCTRL can be generated by the control circuit 410, 300 of FIG. 3, as described in U.S. Provisional Application No. 63/337,162.

Figure 8:
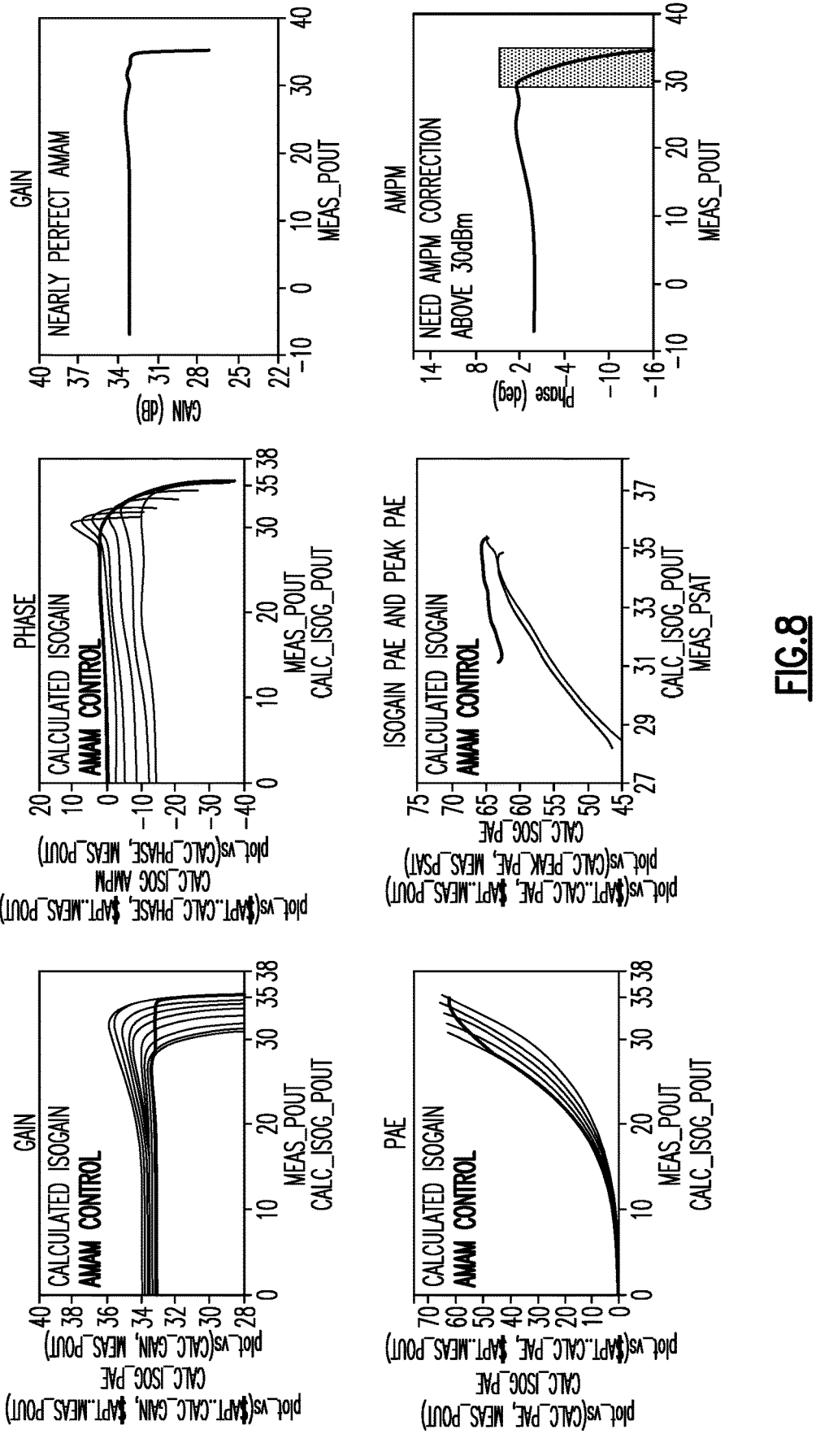
FIG. 8 shows performance plots of the power amplifier of FIG. 4 with AMAM control provided as described herein.

FIG. 8 shows gain, phase and PAE plots of the power amplifier of FIG. 4 with AMAM control provided as described herein. As shown in the gain vs output power plot in the upper right panel, nearly ideal AMAM characteristic is displayed. However, and as shown in the phase vs output power in the lower right panel, AMPM correction above 30 dBm is desirable.

Figure 9:
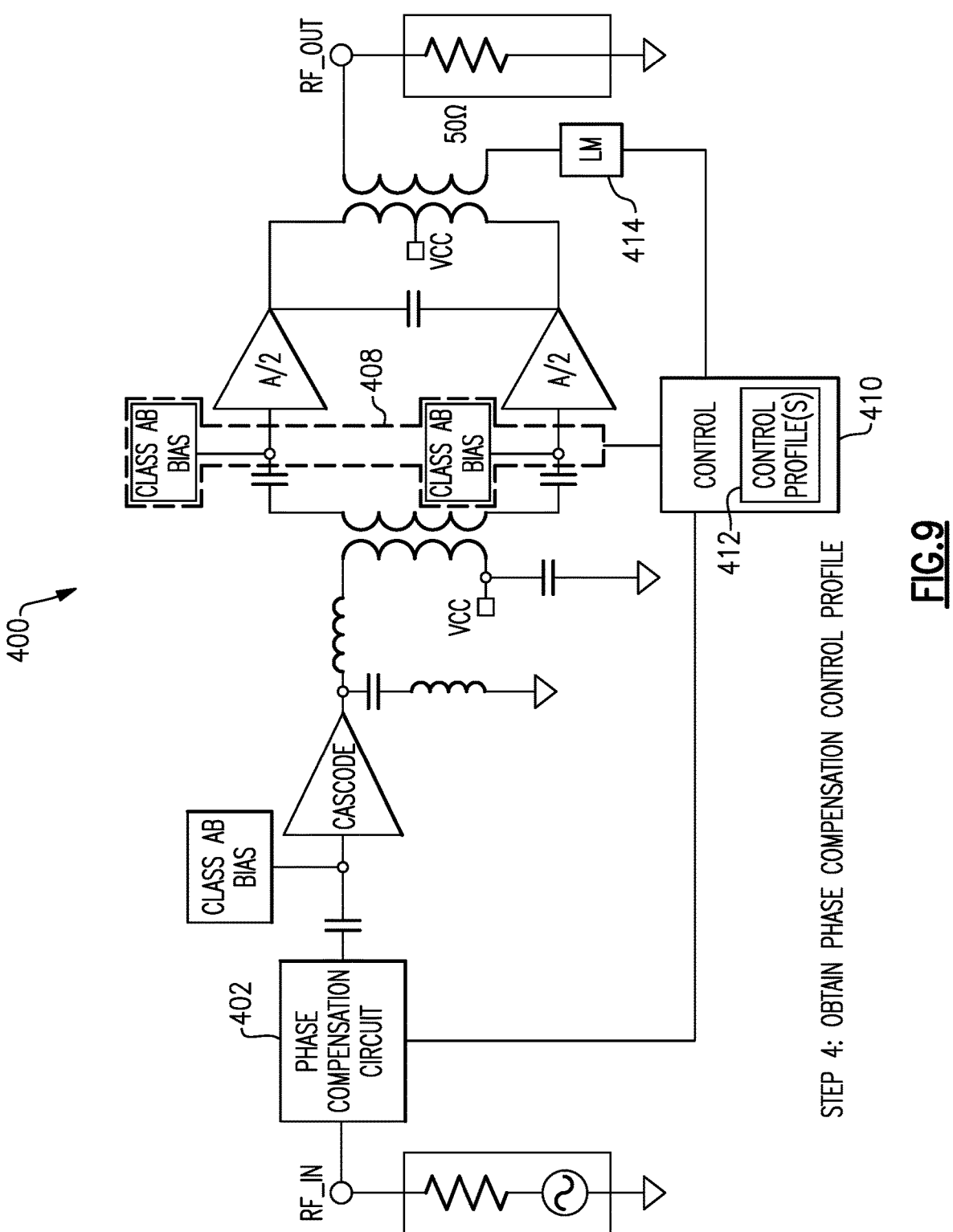
FIG. 9 shows another example step that can be implemented to provide desired control for the power amplifier system of FIG. 2.

FIG. 9 shows that Step 4 can include obtaining of a phase compensation control profile. Such a step can include running an input power sweep with AMAM control driving the load modulator. Results from such a sweep should match or be similar to the above-described ISOGAIN profile. Step 4 can further include designing or configuring a phase compensation to match AMPM vs VB2 characteristic, similar to the example described in U.S. Provisional Application No. 63/337,162.

Figure 10:
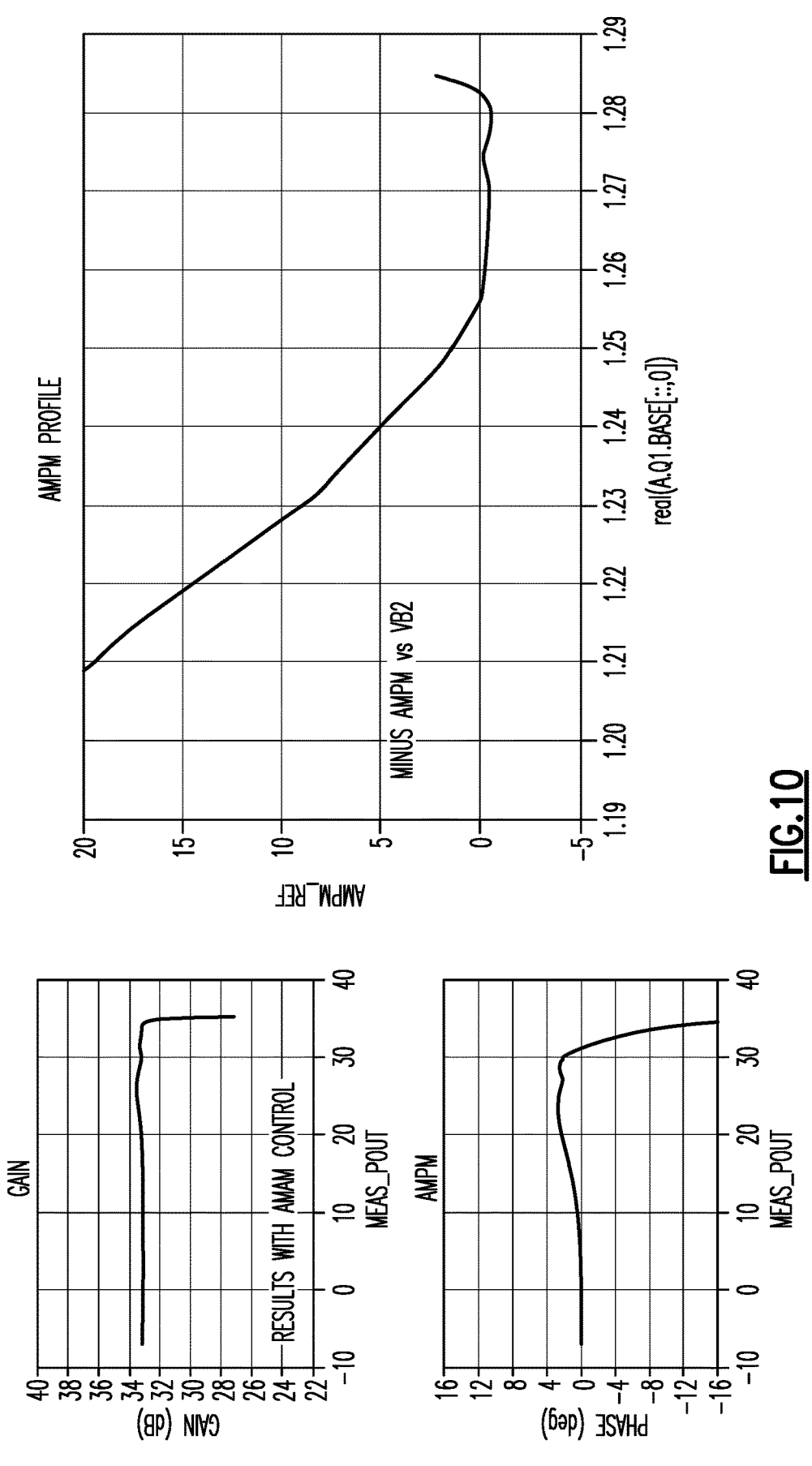
FIG. 10 shows an example of a desired performance that can be obtained from the step of FIG. 9.

FIG. 10 shows an example of a desired AMPM vs VB2 that can be obtained from Step 4.

Figure 11:
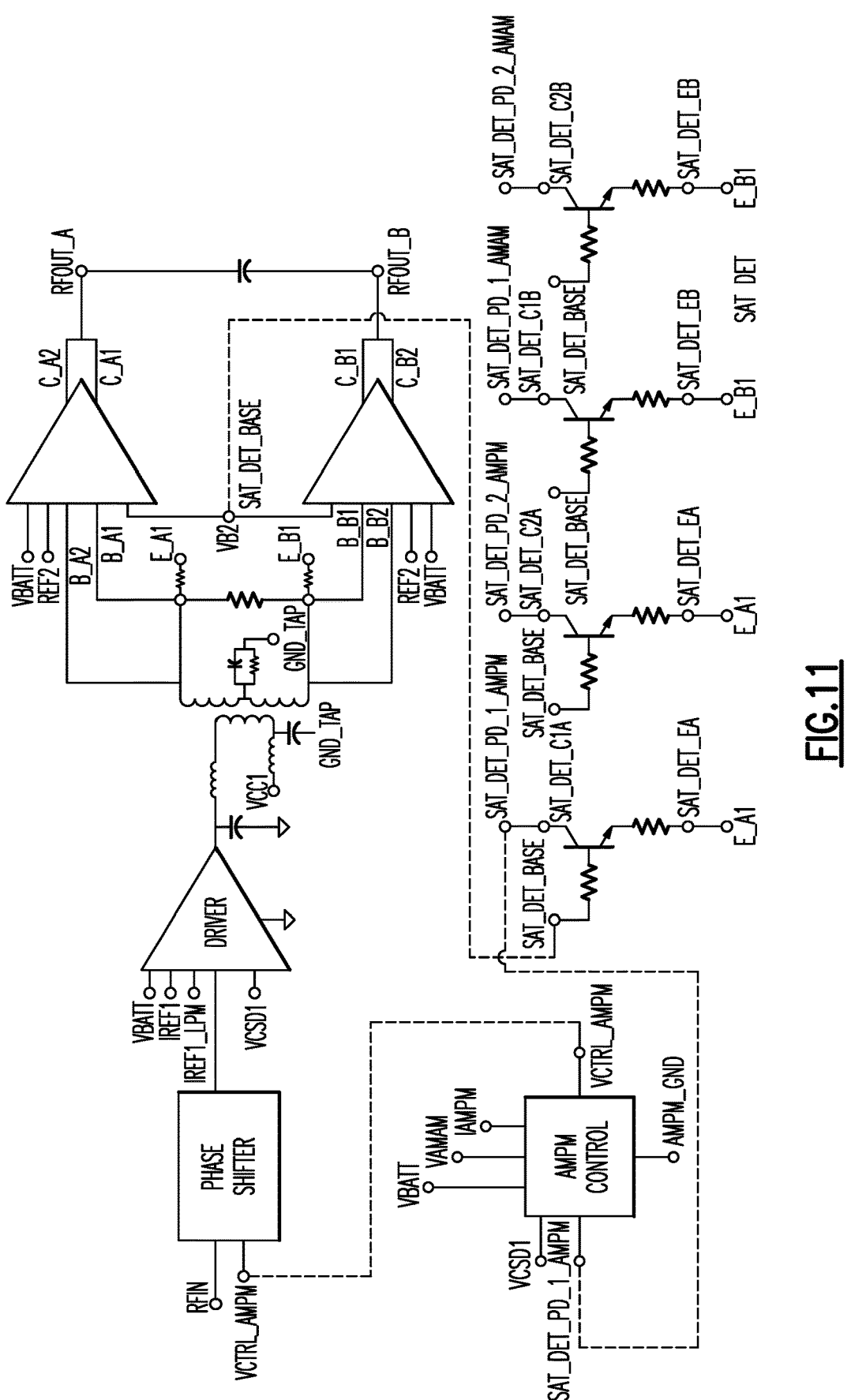
FIG. 11 depicts an example of how AMPM control with the control circuit of FIG. 3 can be implemented.

FIG. 11 depicts an example of how AMPM control with the control circuit 410, 300 of FIG. 3 can be implemented, as described in U.S. Provisional Application No. 63/337, 162.

Figure 12:
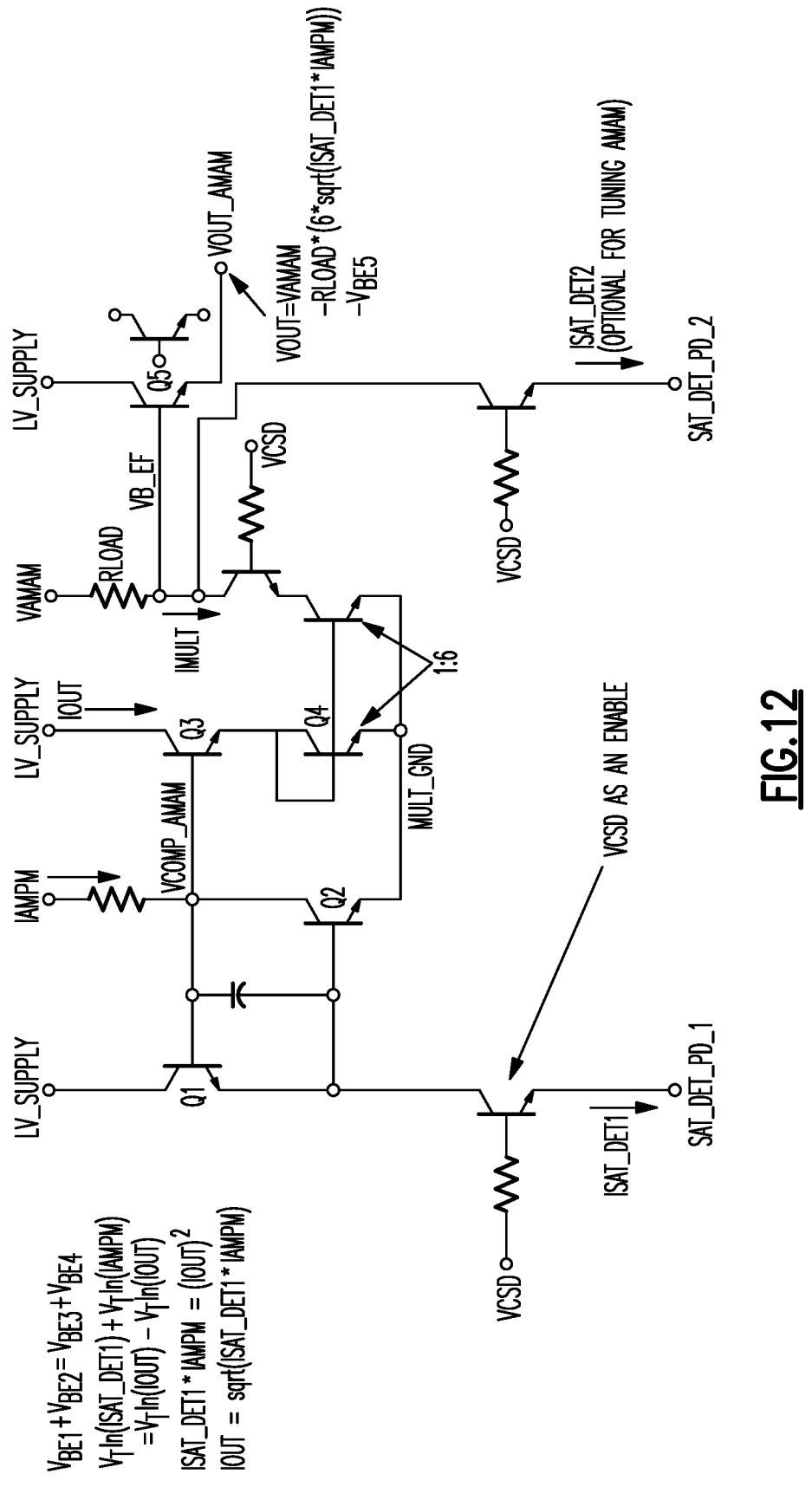
FIG. 12 shows an example of how control signal can be generated by the control circuit of FIG. 3 to provide AMPM control.

FIG. 12 shows an example of how the control signal VCTRL can be generated by the control circuit 410, 300 of FIG. 3 to provide AMPM control, as described in U.S. Provisional Application No. 63/337,162.

Figure 13A:
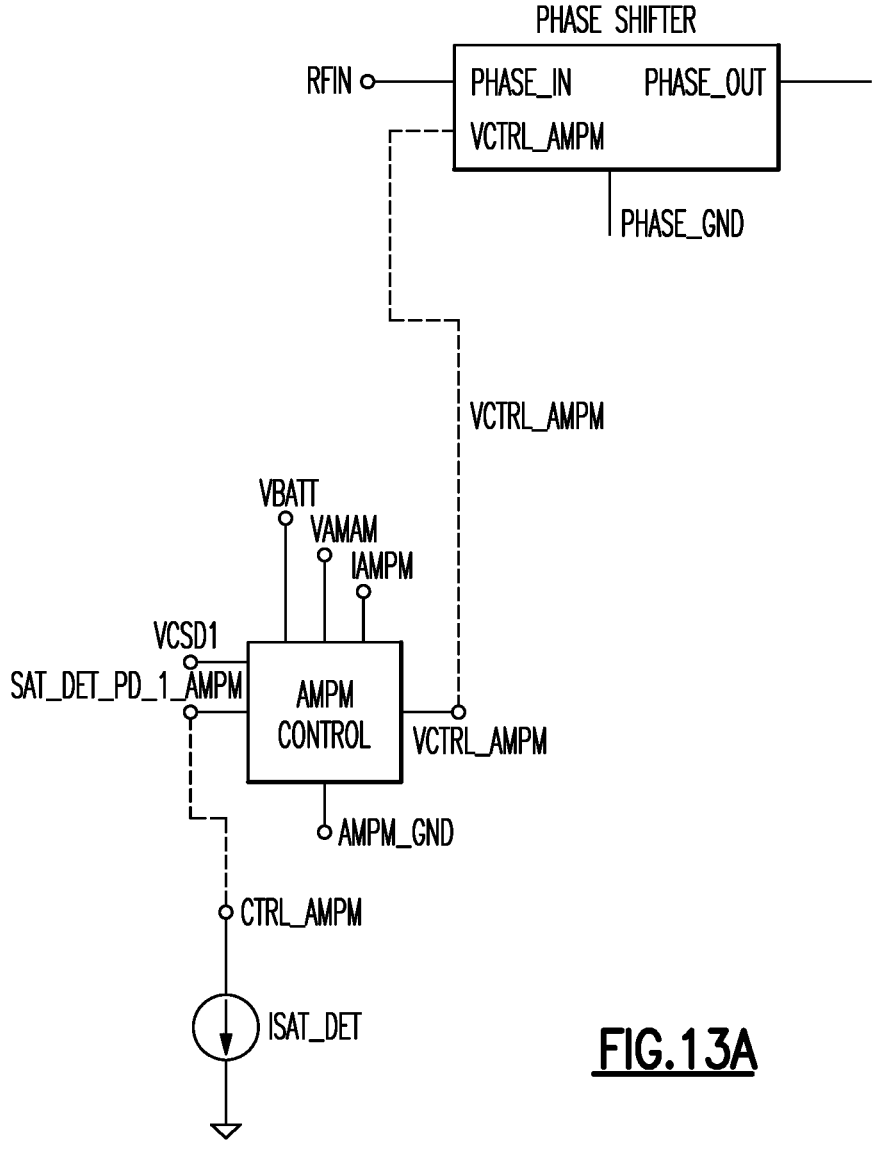
FIG. 13A shows the power amplifier system of FIG. 9 in a simplified manner with selected parameters emphasized.
Figure 13B:
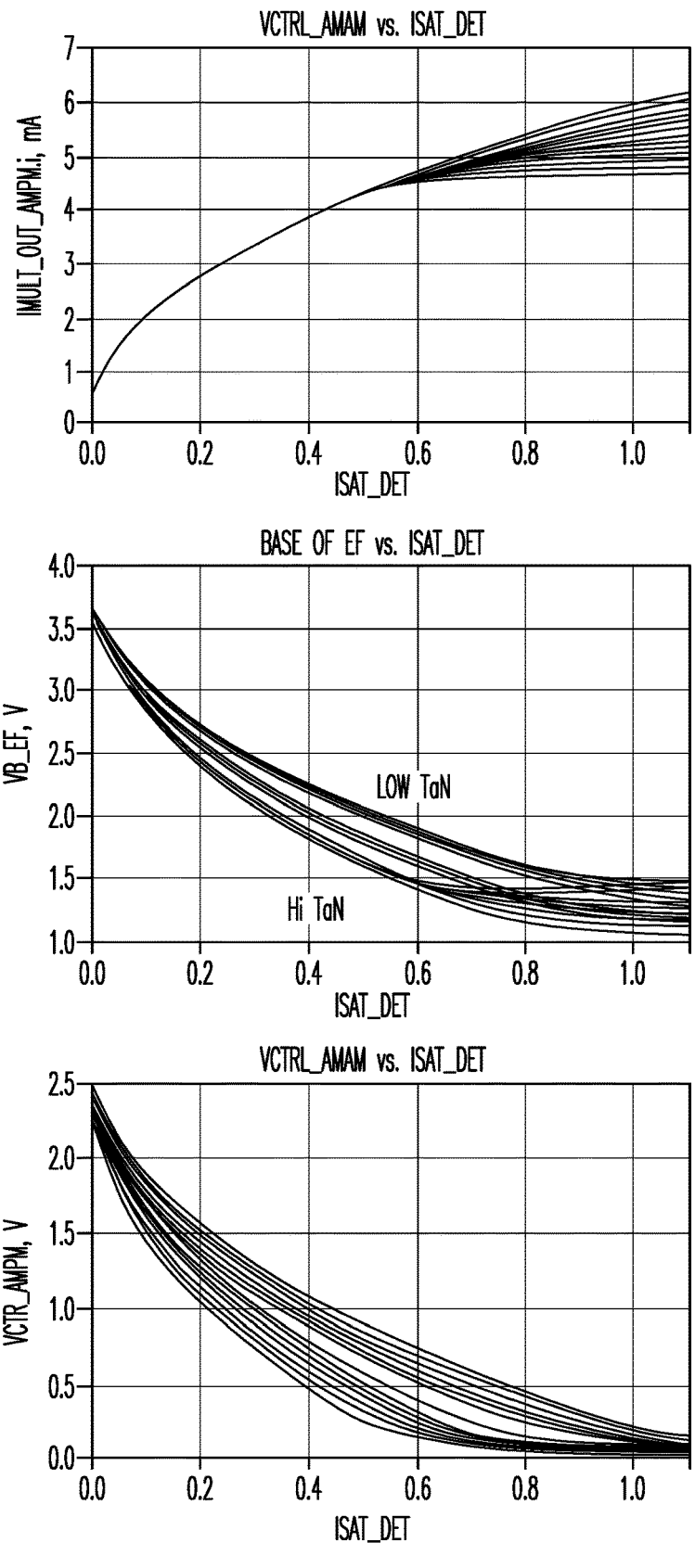
FIG. 13B shows various simulation results as operating temperature is varied.

FIG. 13A shows the power amplifier system 400 of FIG. 9 in a simplified manner with selected parameters emphasized. FIG. 13B shows various simulation results as operating temperature is varied from −30 deg. C. to 85 deg. C. One can see in the top panel that output current is very consistent over the range of temperature.

Figure 14A:
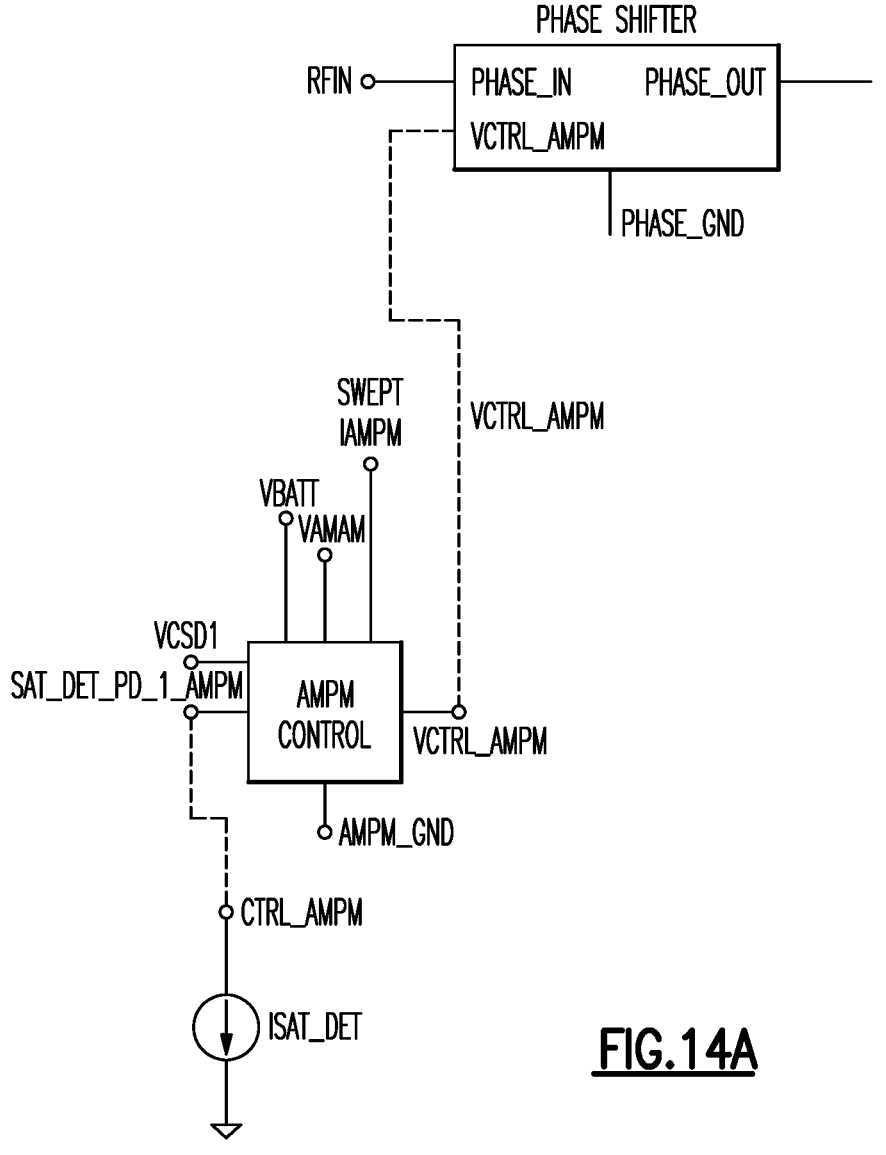
FIG. 14A shows the power amplifier system of FIG. 9 in a simplified manner with selected parameters emphasized.
Figure 14B:
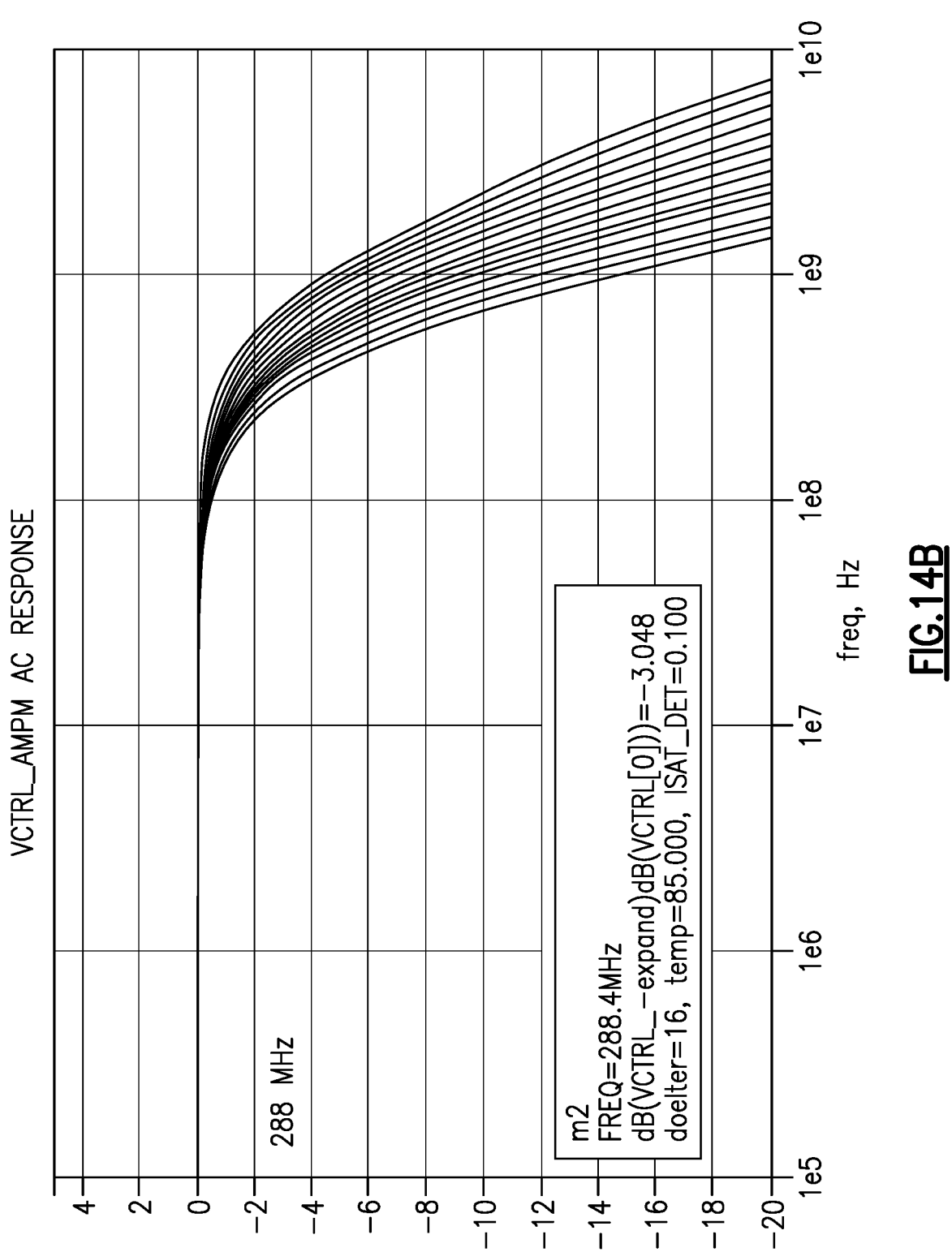
FIG. 14B shows VCTRL_AMPM curves as operating temperature is varied.

FIG. 14A shows the power amplifier system 400 of FIG. 9 in a simplified manner with selected parameters emphasized. FIG. 14B shows VCTRL_AMPM curves as operating temperature is varied from −30 deg. C. to 85 deg. C.

Figure 15:
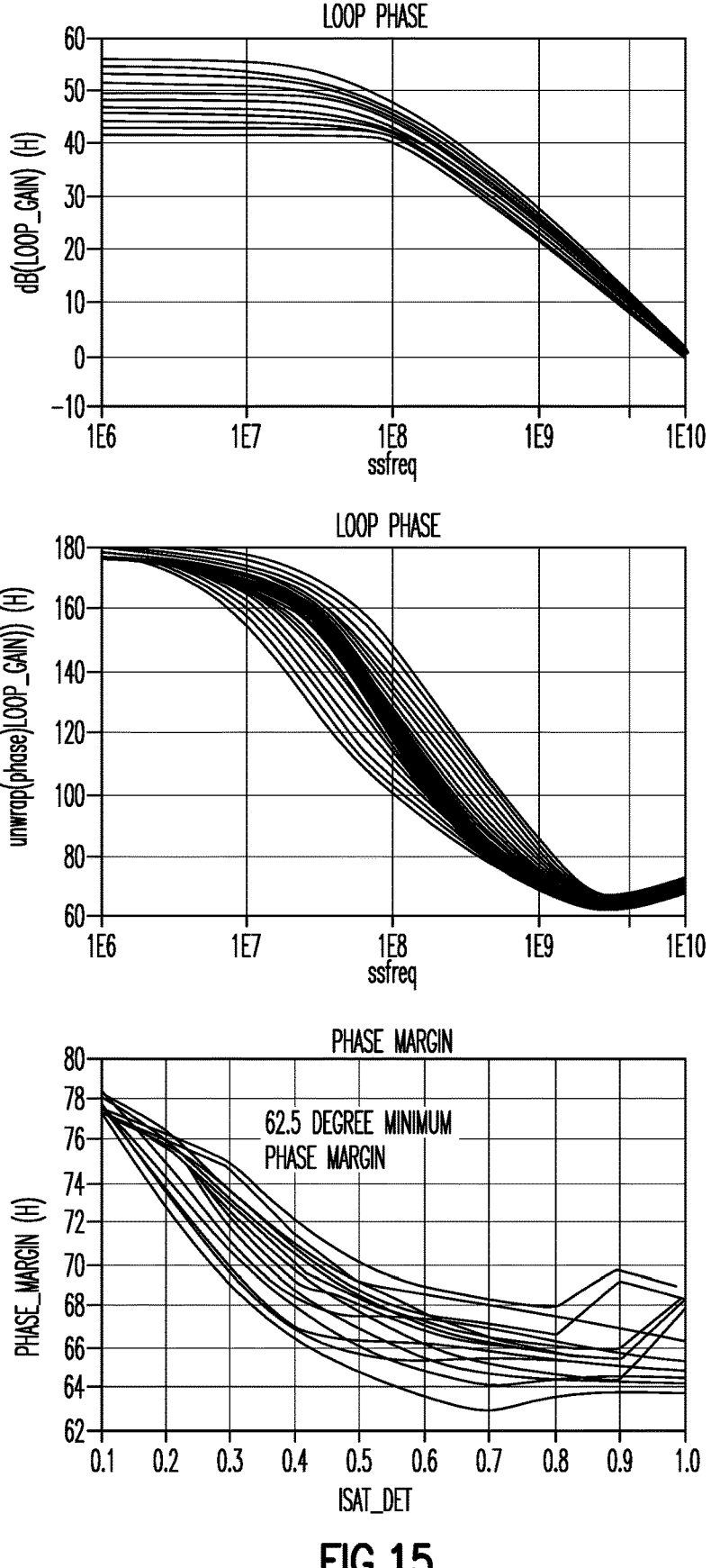
FIG. 15 shows loop gain plots for different temperatures.

FIG. 15 shows a loop portion emphasized, similar to the example in U.S. Provisional Application No. 63/337,162. FIG. 15B shows loop gain, loop phase and phase margin plots for different temperatures in a range of −30 deg. C. to 85 deg. C. As shown in the bottom panel, a minimum phase margin of 62.5 degrees is present.

Figure 16:
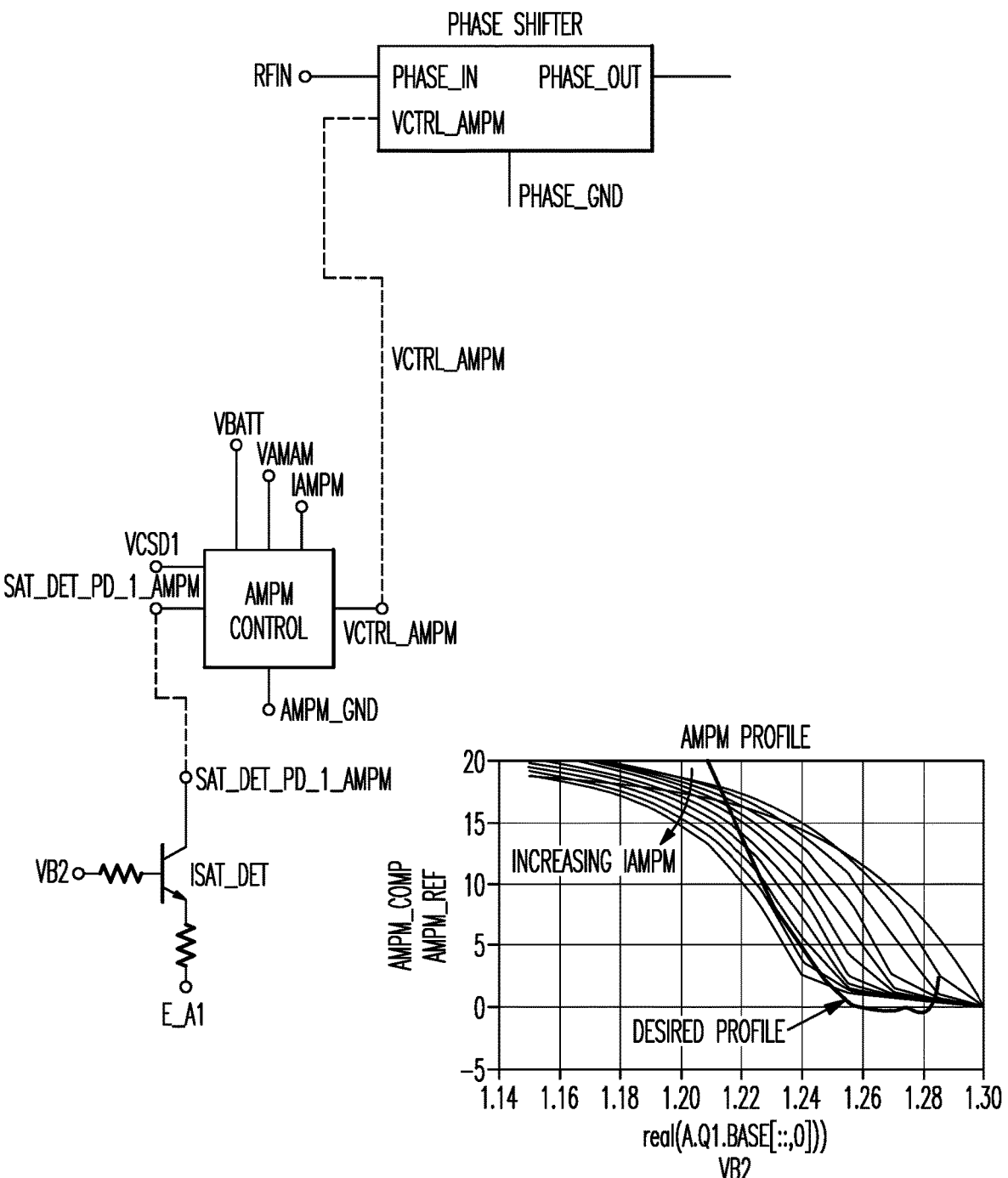
FIG. 16 shows the power amplifier system of FIG. 9 in a simplified manner with selected parameters emphasized.

FIG. 16 shows the power amplifier system 400 of FIG. 9 in a simplified manner with selected parameters emphasized. FIG. 16 also shows AMPM profiles as a function of VB2 as IAMPM is swept.

Figure 17:
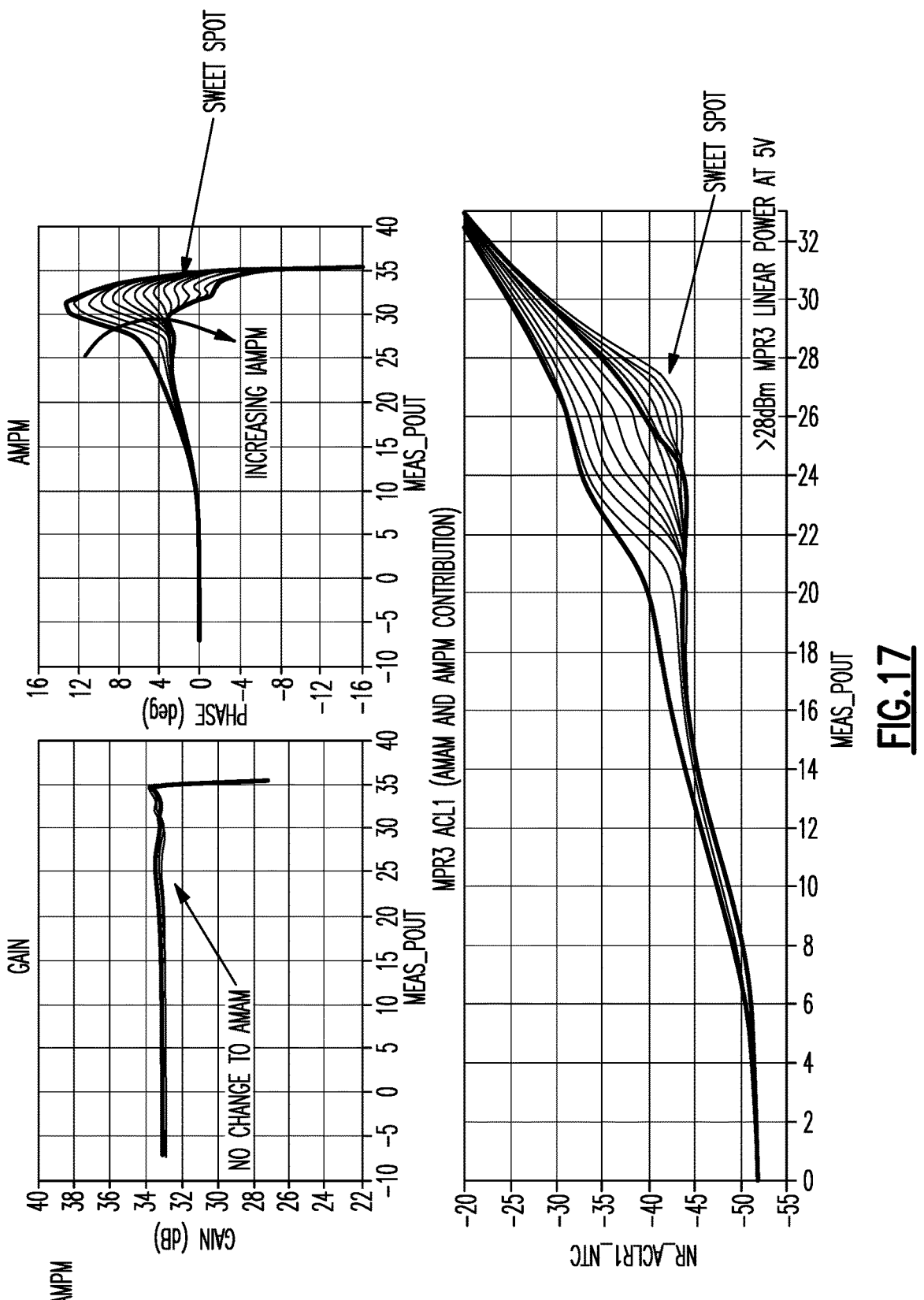
FIG. 17 show example plots obtained with phase compensation as described herein.

FIG. 17 show example plots obtained with phase compensation as described herein. In the gain plots with and without AMPM compensation, one can see that the AMAM profile does not change significantly. Plots of AMPM vs output power show that there is a desired sweet spot that could be obtained and implemented as described herein. Similarly, plots of ACLR vs output power show that there is a desired sweet spot that could be obtained and implemented as described herein.

Figure 18:
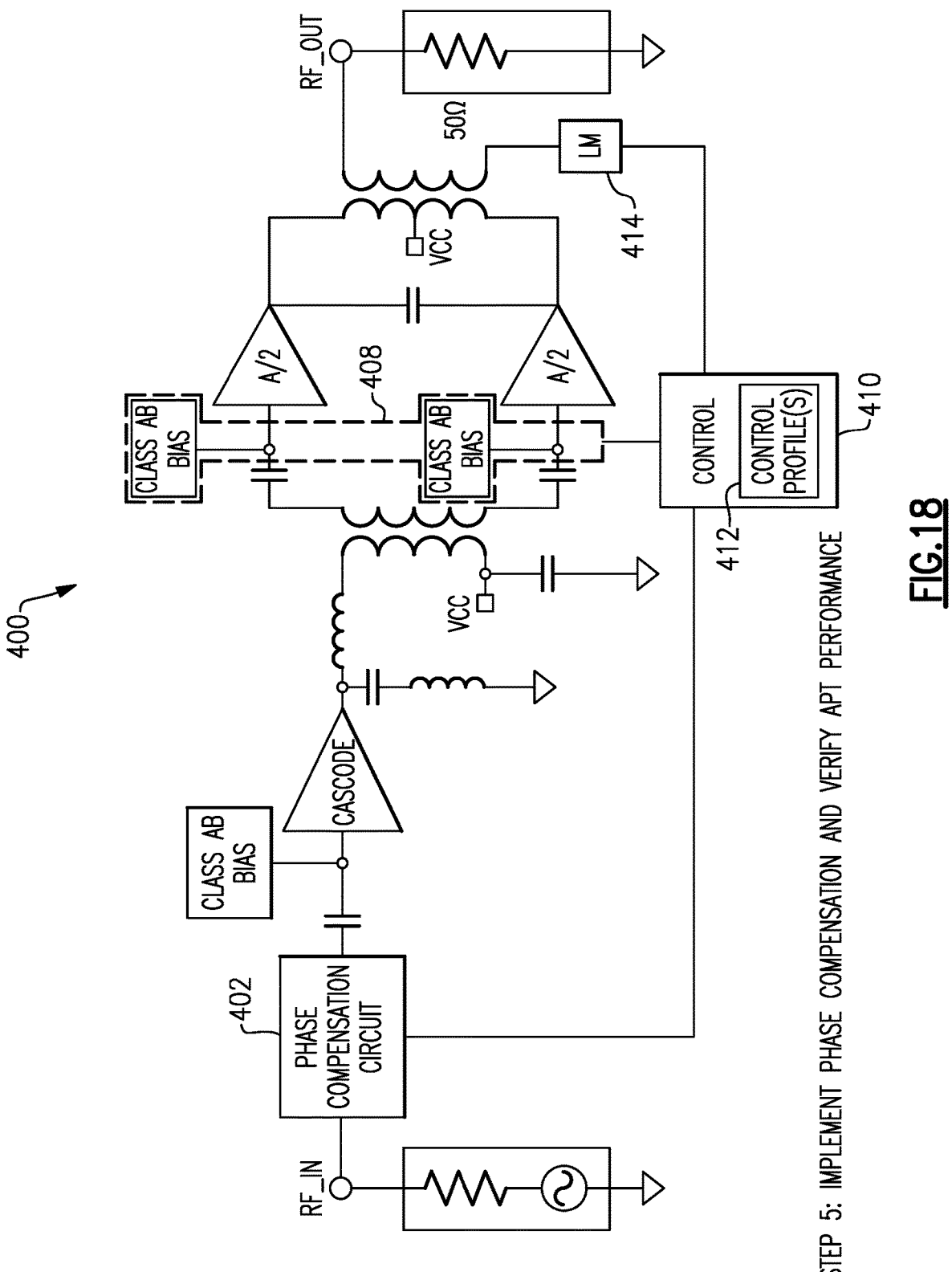
FIG. 18 shows another example step that can be implemented to provide desired control for the power amplifier system of FIG. 2.

FIG. 18 shows that Step 5 can include implementing phase compensation and verifying APT performance. In some embodiments, such phase compensation can be implemented with a phase compensation circuit described in U.S. Provisional Application No. 63/337,161.

Figure 19:
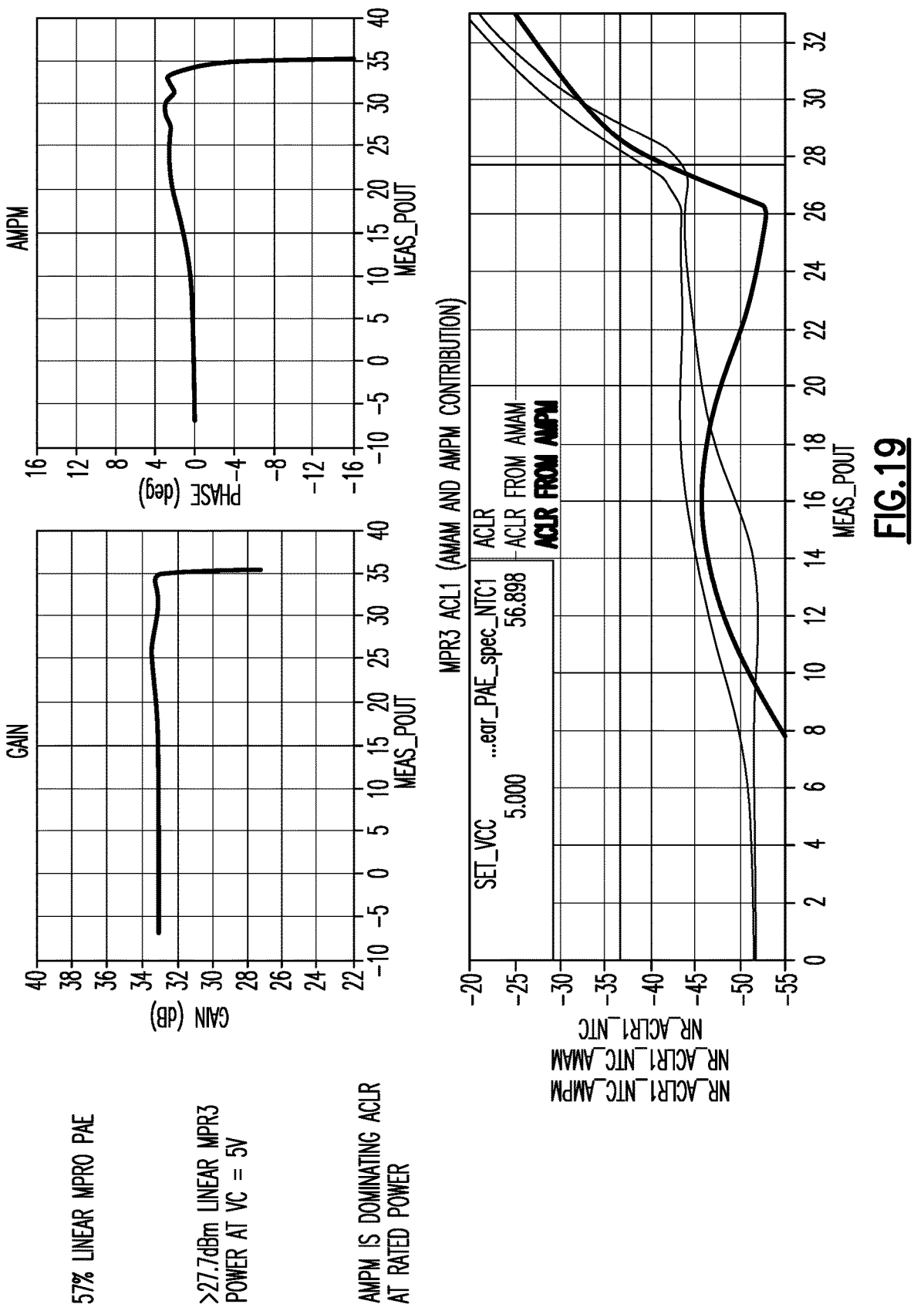
FIG. 19 shows performance plots with the implementation of the step of FIG. 18.

FIG. 19 shows plots of gain, AMPM and ACLR with the implementation of phase compensation according to Step 5.

Figure 20:
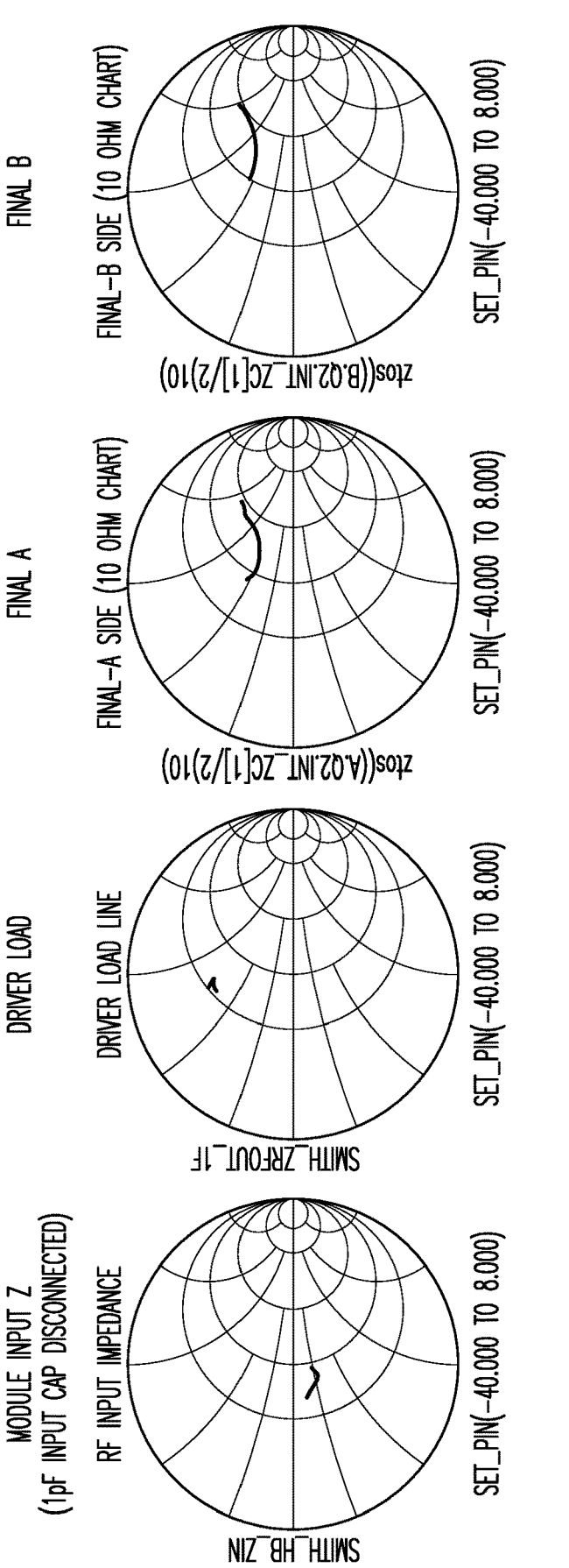
FIG. 20 shows various Smith charts associated with the power amplifier circuit of FIG. 18.

FIG. 20 shows various Smith charts associated with the power amplifier circuit 400 of FIG. 18.

Figure 21:
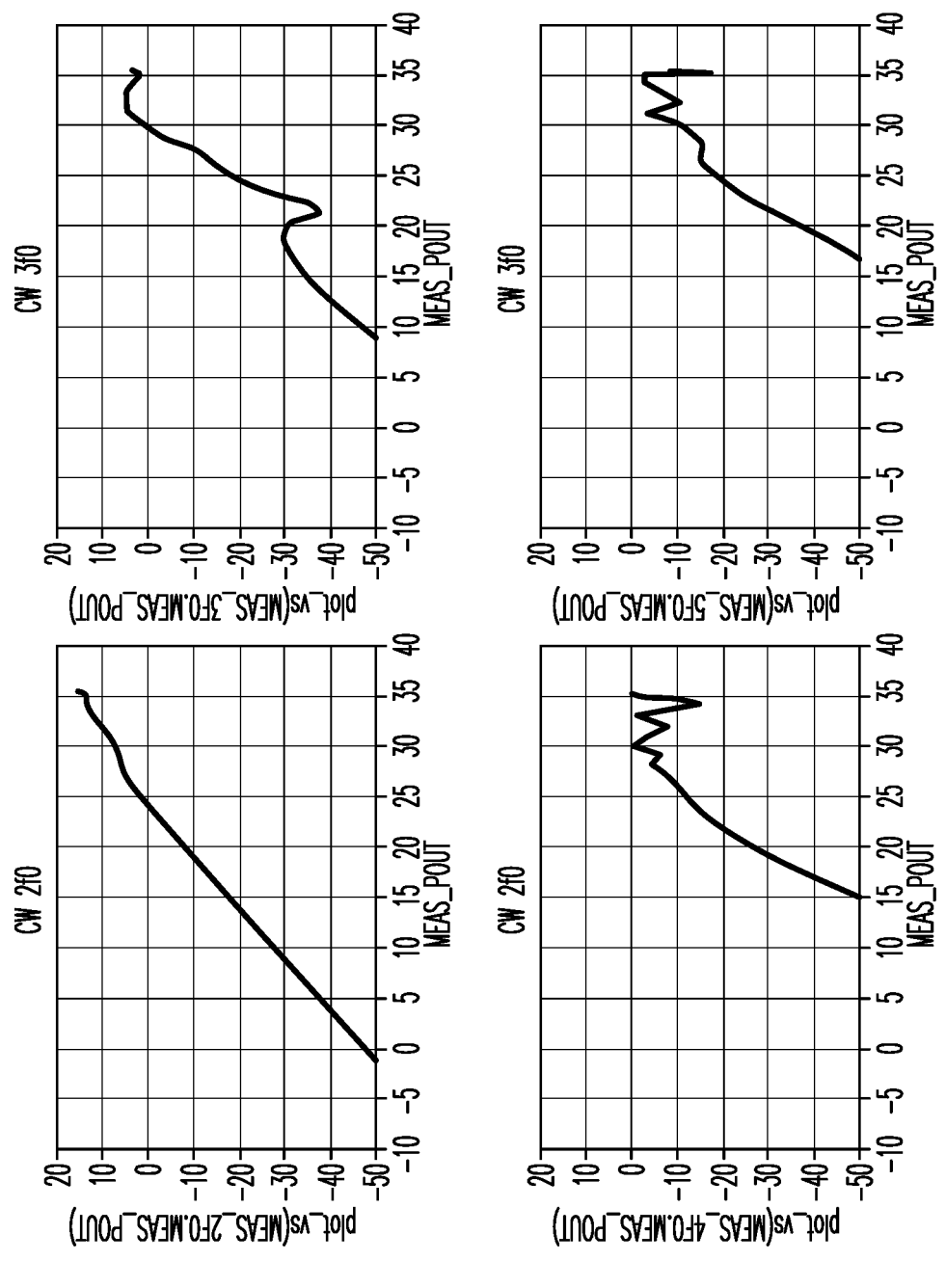
FIG. 21 shows various harmonics associated with the power amplifier circuit of FIG. 18.

FIG. 21 shows various harmonics associated with the power amplifier circuit 400 of FIG. 18.

Figure 22:
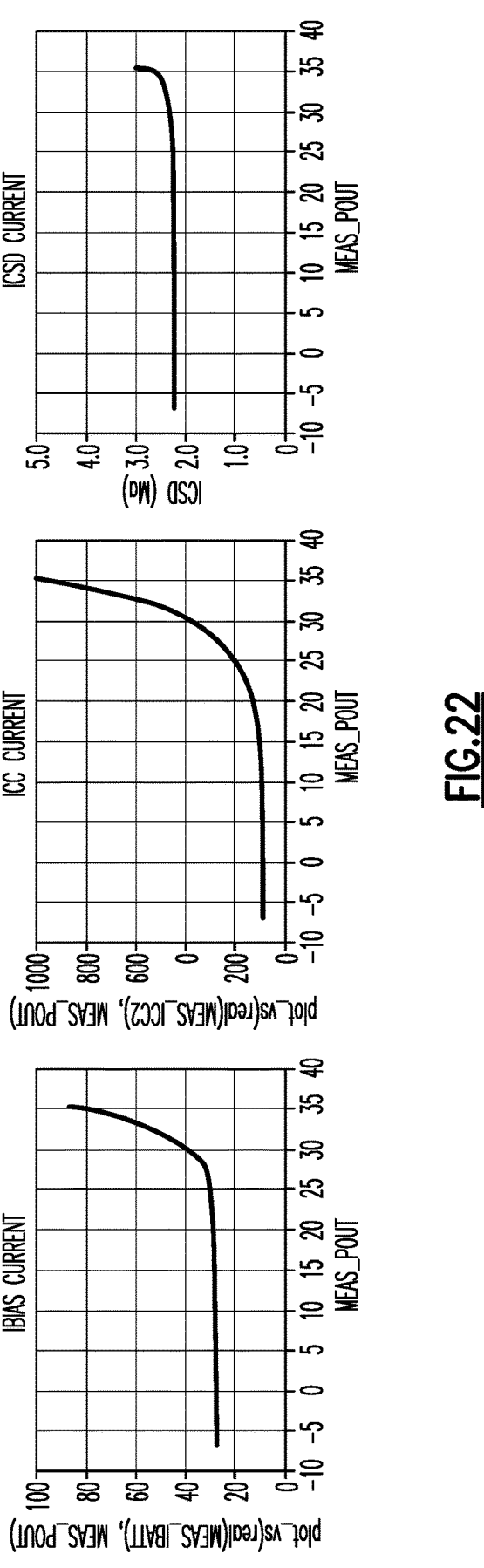
FIG. 22 shows various currents associated with the power amplifier circuit of FIG. 18.

FIG. 22 shows various currents associated with the power amplifier circuit 400 of FIG. 18.

Figure 23:
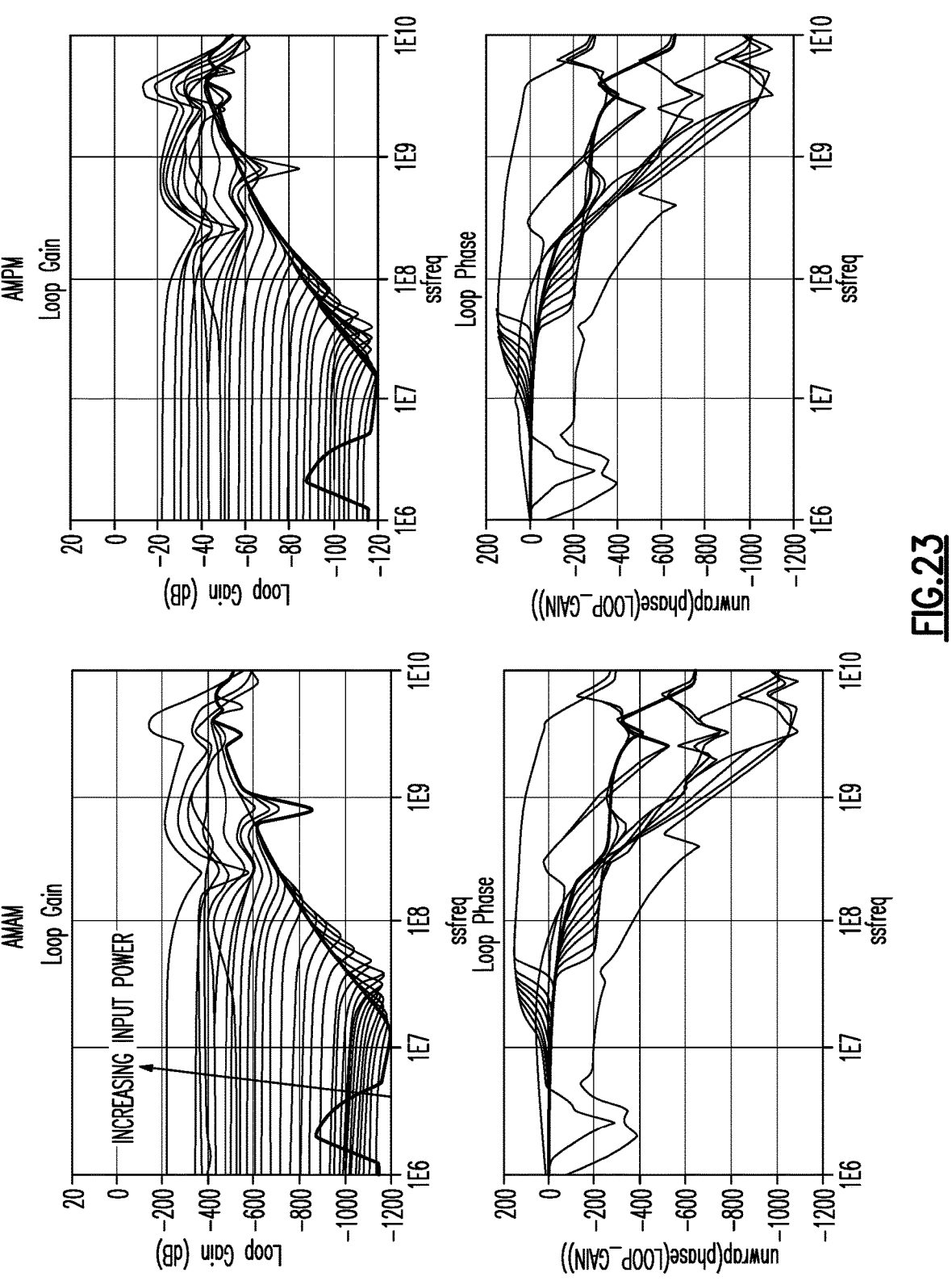
FIG. 23 shows AMAM and AMPM control loop gains associated with the power amplifier circuit of FIG. 18.

FIG. 23 shows AMAM and AMPM control loop gains associated with the power amplifier circuit 400 of FIG. 18. It is noted that AMAM control behaves in a feed forward manner. It is also noted that input phase and base amplitude do not appear to be correlated.

Figure 24:
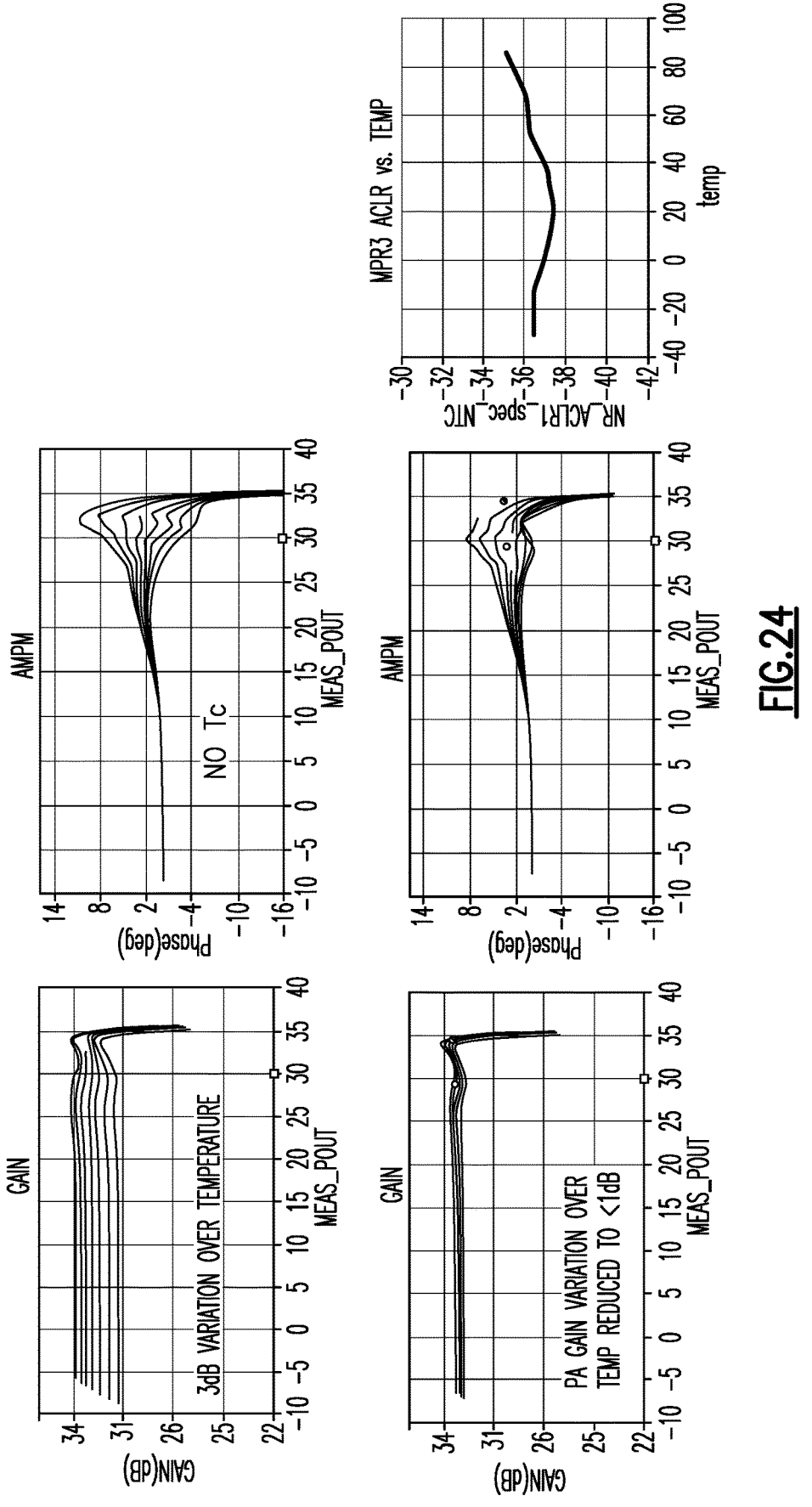
FIG. 24 shows performance plots over a range of temperature.

FIG. 24 shows gain, AMPM and ACLR plots over a range of temperature.

Figure 25:
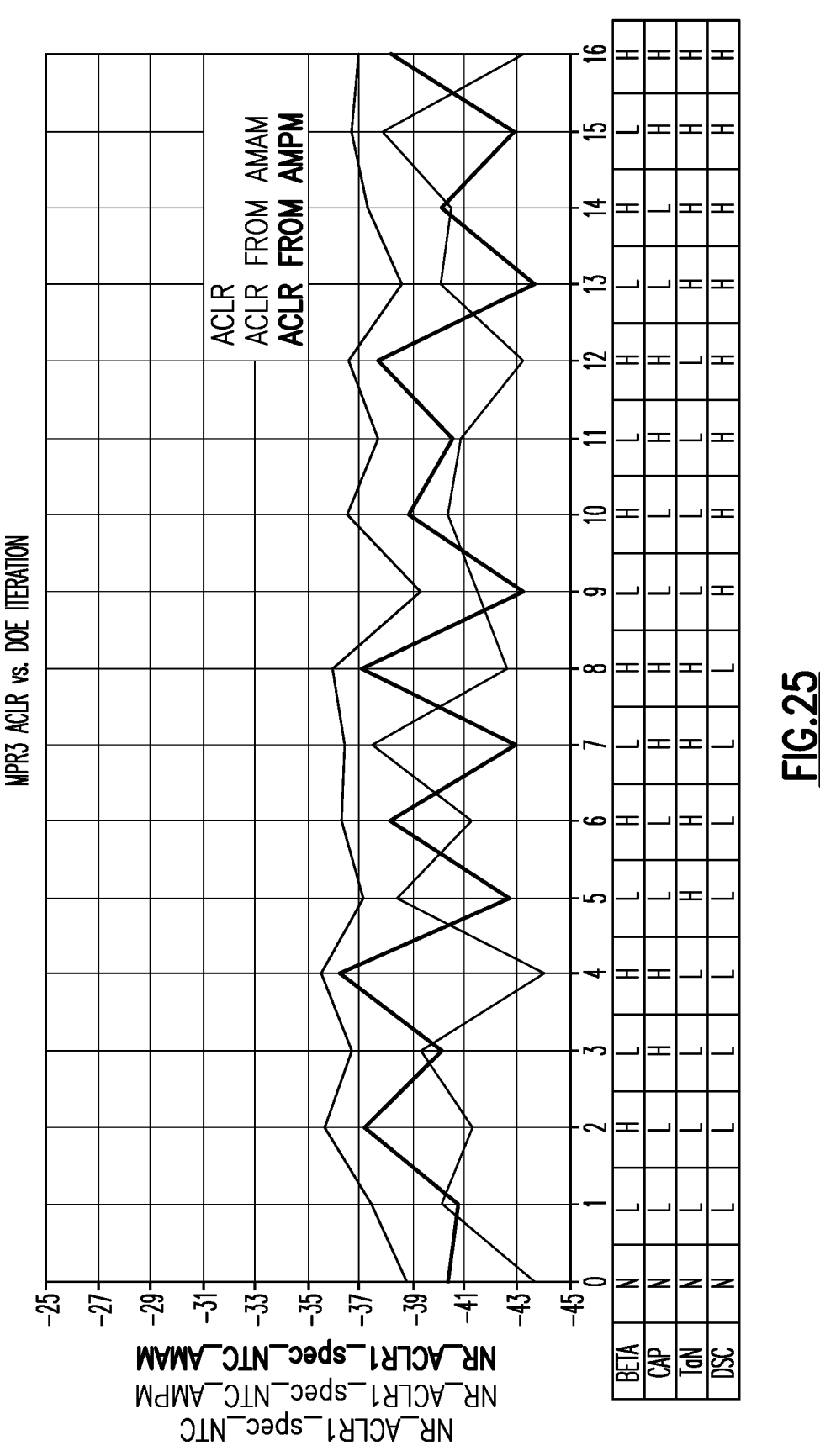
FIG. 25 shows performance plots over process variation associated with capacitances of the phase compensation circuit.

FIG. 25 shows gain, AMPM and ACLR plots over process variation associated with capacitances of the phase compensation circuit.

Figure 26:
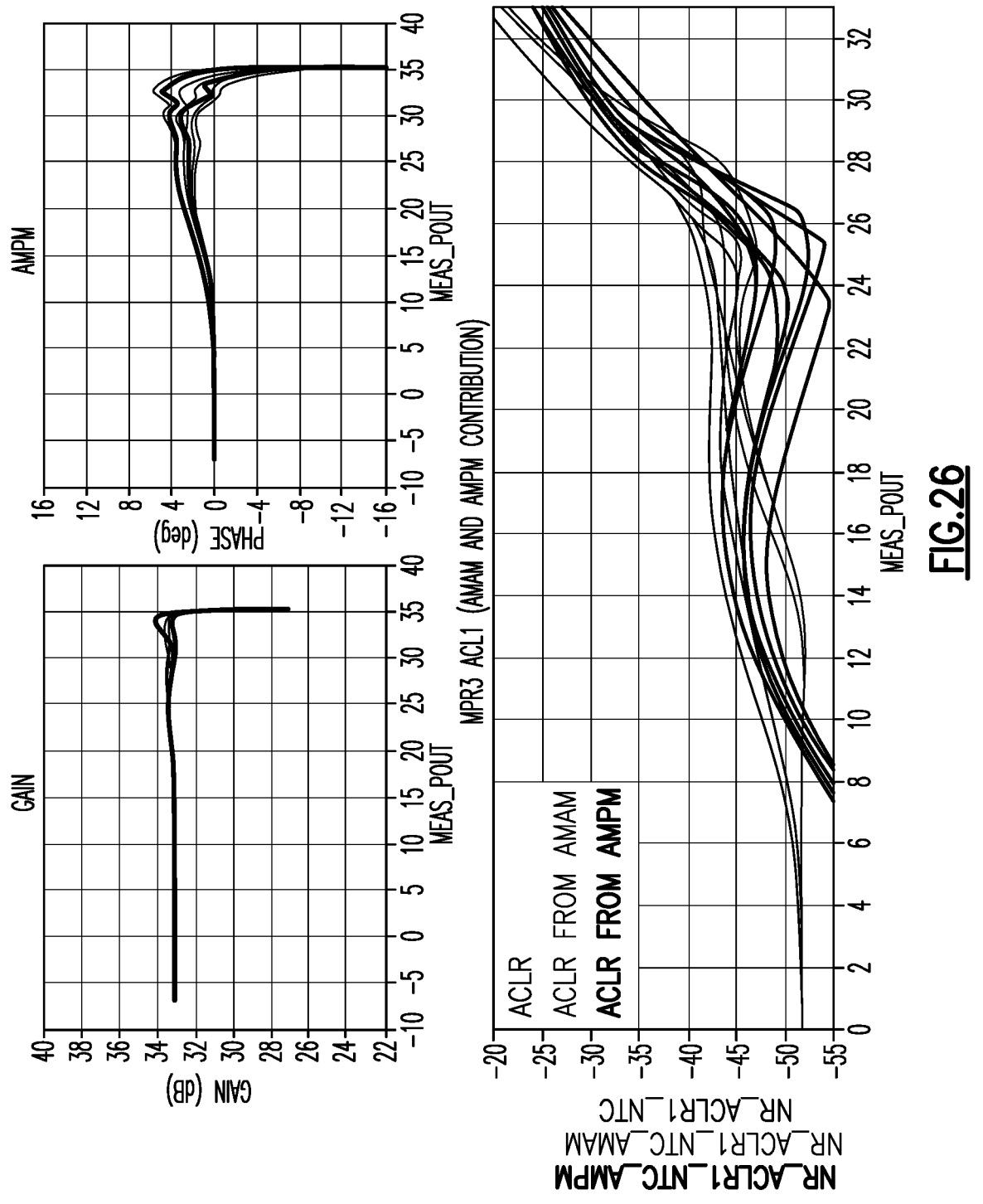
FIG. 26 shows performance plots with the implementation of phase compensation as described herein.

FIG. 26 shows plots of gain, AMPM and ACLR with the implementation of phase compensation as described herein.

Figure 27:
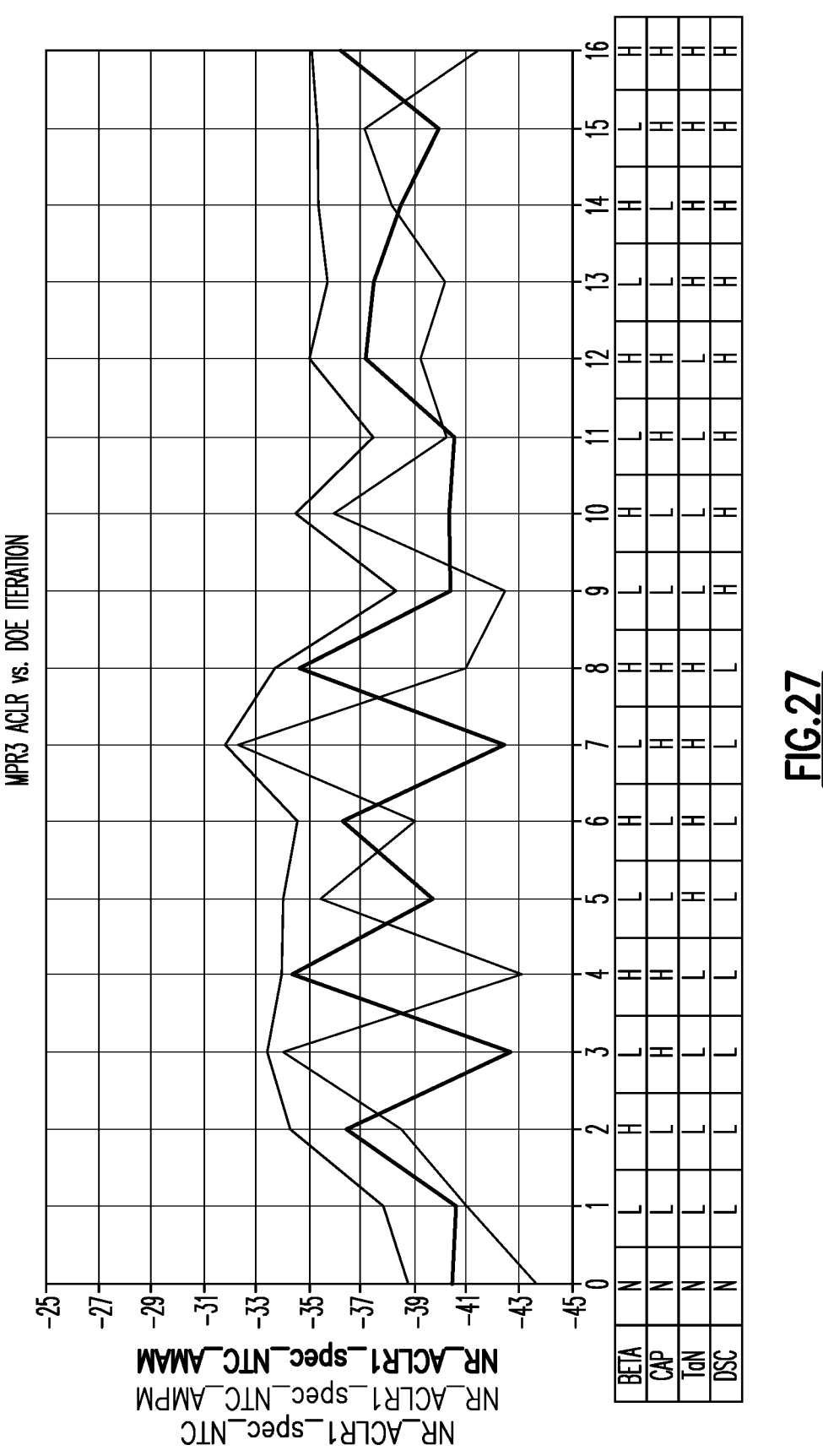
FIG. 27 shows another example of performance plots over process variation associated with capacitances of the phase compensation circuit.

FIG. 27 shows another example of gain, AMPM and ACLR plots over process variation associated with capacitances of the phase compensation circuit.

Figure 28:
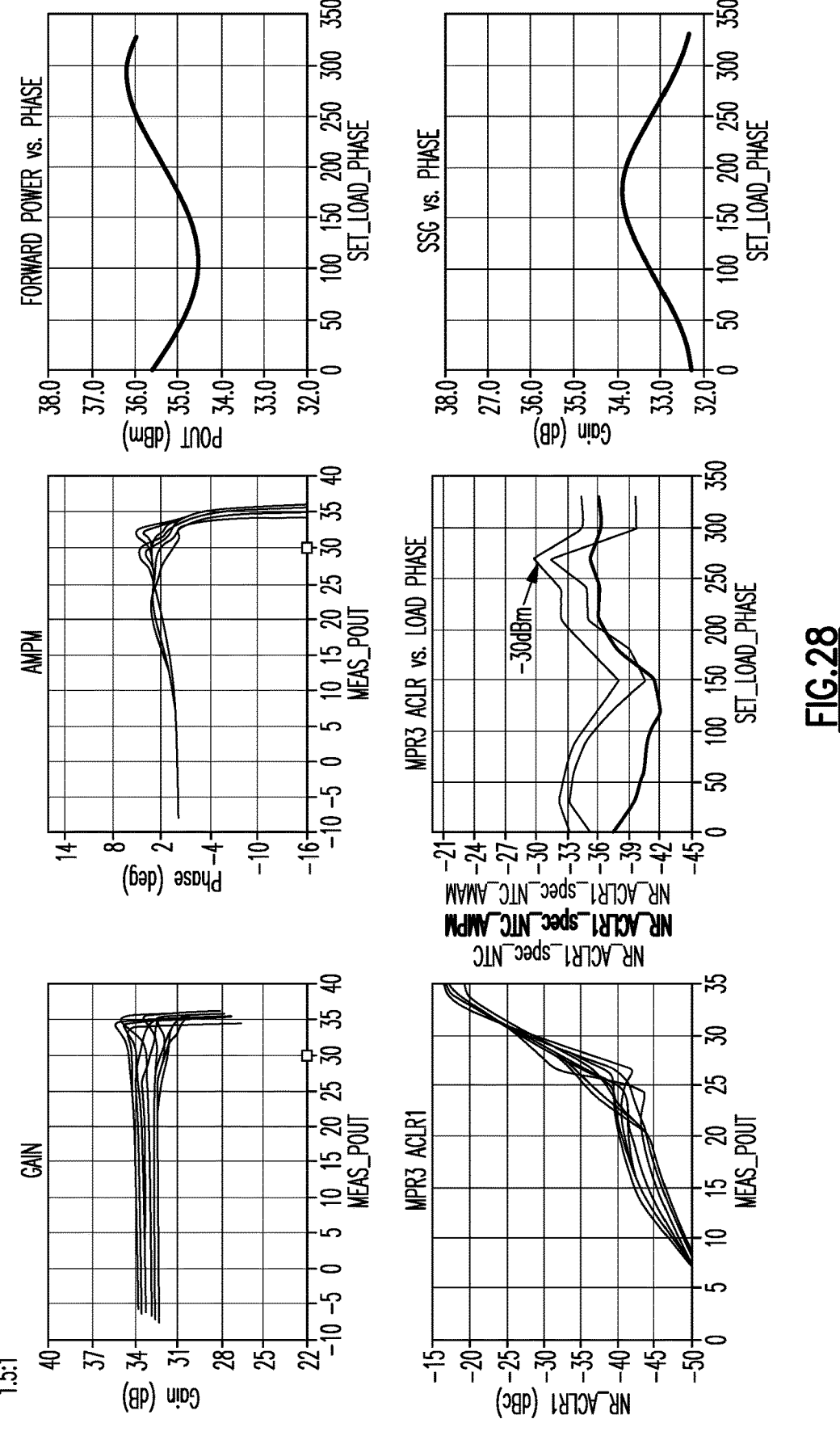
FIG. 28 shows performance plots with the implementation of phase compensation as described herein, and with load VSWR of 1.5:1.

FIG. 28 shows plots of gain, AMPM and ACLR with the implementation of phase compensation as described herein, and with load VSWR of 1.5:1.

Figure 29:
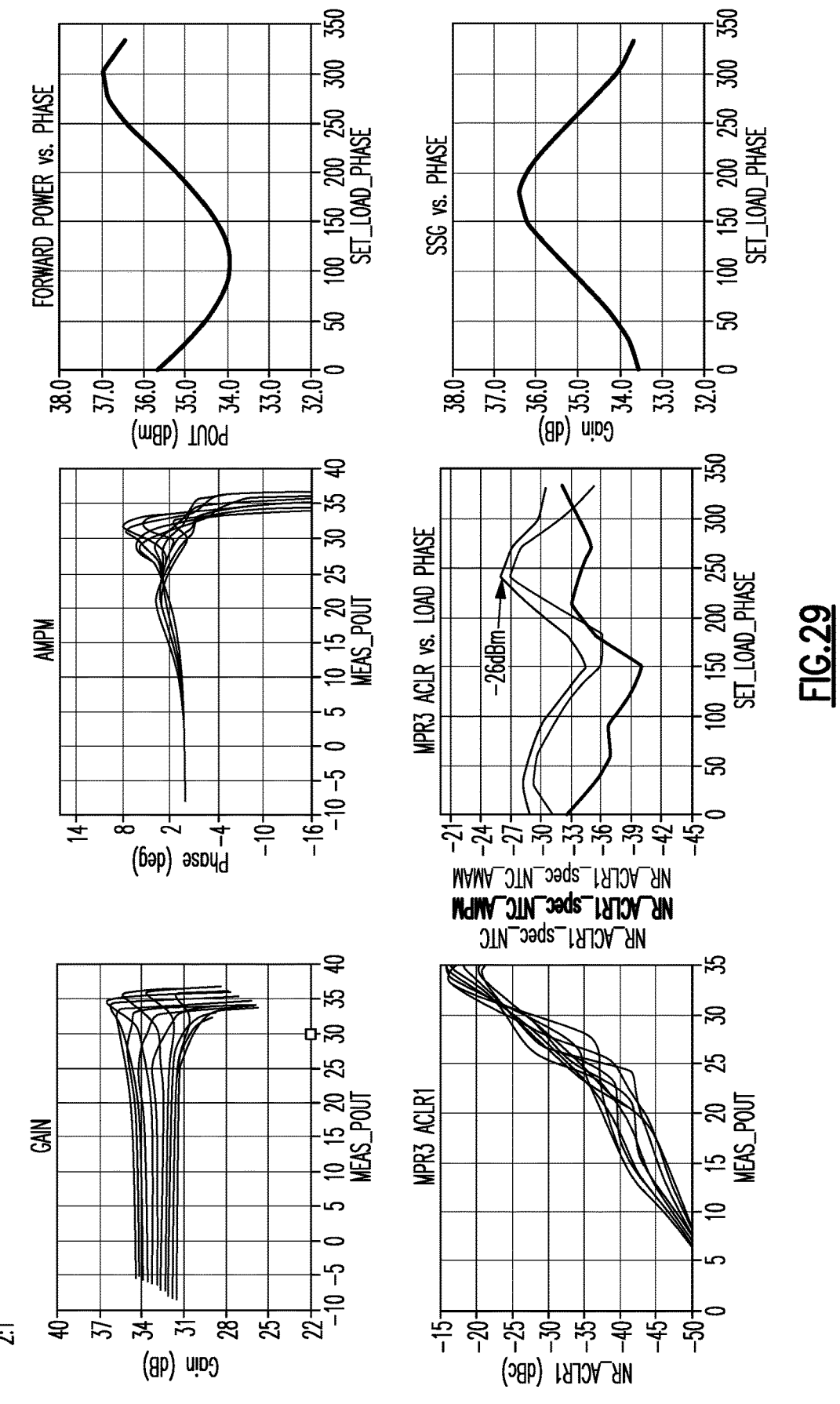
FIG. 29 shows performance plots with the implementation of phase compensation as described herein, and with load VSWR of 2:1.

FIG. 29 shows plots of gain, AMPM and ACLR with the implementation of phase compensation as described herein, and with load VSWR of 2:1. In some applications, there is too much expansion at low collector Z angles.

Figure 30:
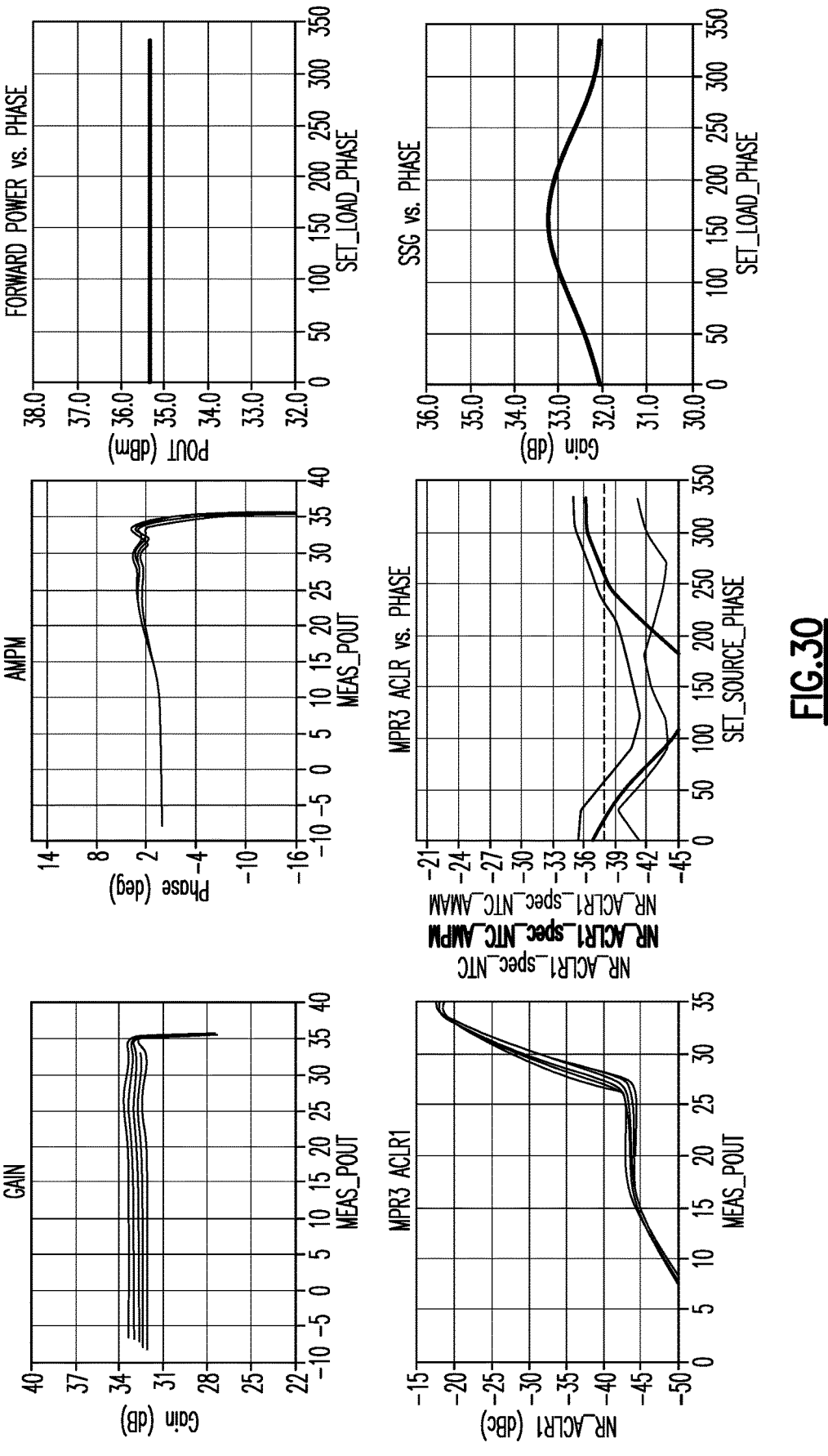
FIG. 30 shows performance plots with the implementation of phase compensation as described herein, and with source VSWR of 2:1.

FIG. 30 shows plots of gain, AMPM and ACLR with the implementation of phase compensation as described herein, and with source VSWR of 2:1. One can see that there is very little ACLR variation from AMAM, and about +/−3 dB variation from AMPM.

Figure 31:
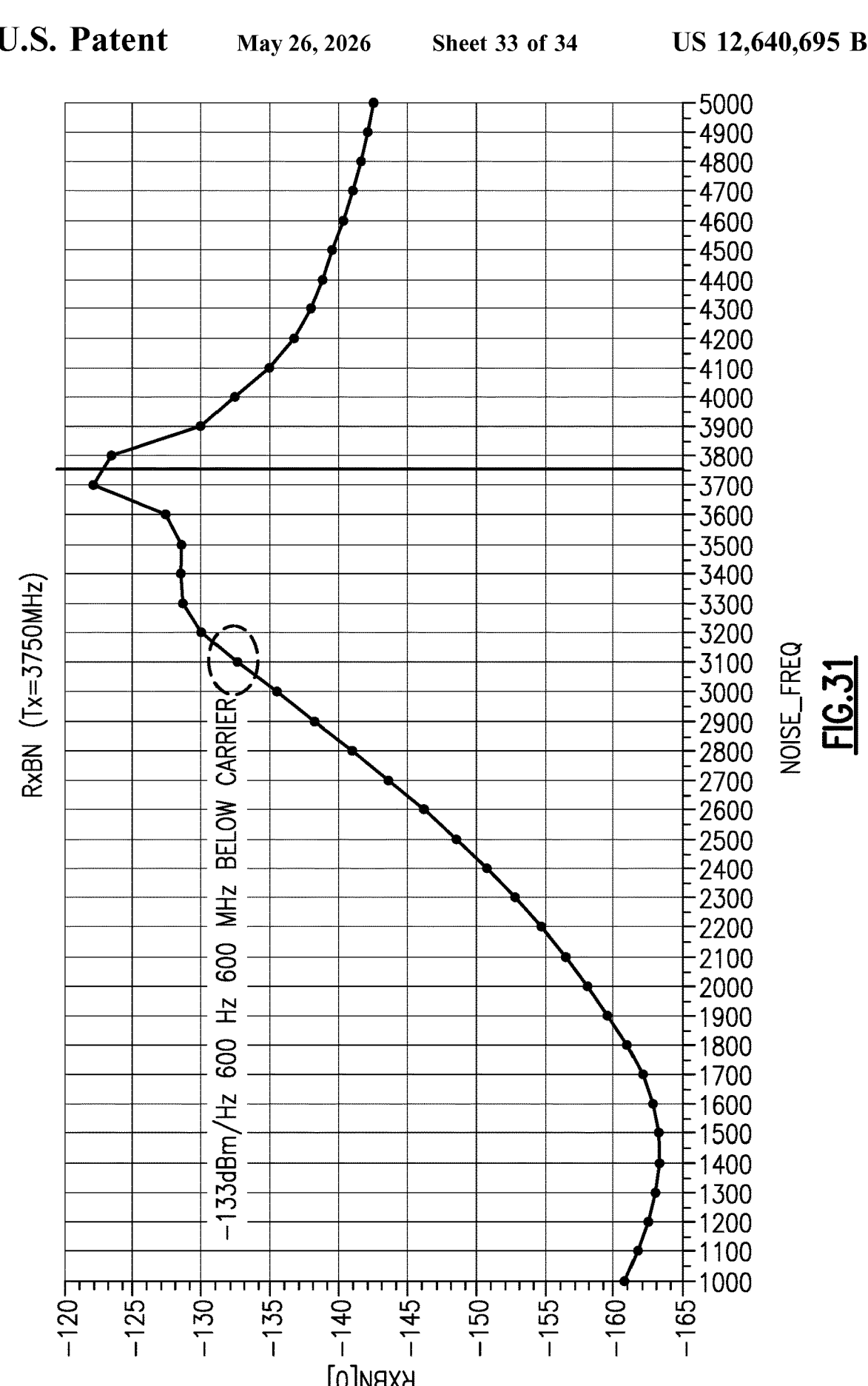
FIG. 31 shows an example of a receive performance as a function of noise frequency, when a transmission operation is in progress.

FIG. 31 shows a plot of RxBN as a function of noise frequency, when a transmission operation is in progress at 3,750 MHz. One can see that there is approximately −133 dBm/Hz at 600 MHz below the Tx carrier frequency.

As described herein, a high linearity and wide bandwidth variable capacitance being connected to the secondary of an output combining/matching balun can provide a number of desirable features. Such features can allow the load presented to the power amplifier to be modulated as a function of a control voltage.

As also described herein, a desired amplitude control voltage profile can be obtained to optimize AMAM across the entire dynamic range. A saturation detection and amplitude processing circuit as described herein can provide such a voltage profile to the variable capacitance of the load modulator.

The foregoing AMAM control results in a very highly efficient power amplifier with flat AMAM across the dynamic range. A tradeoff for such a property can include a poor AMPM created with an active load network. However, a wide bandwidth active phase compensation circuit can be implemented at the input of the power amplifier to compensate for the poor AMPM.

As described herein, saturation detection and phase processing circuit can provide a voltage profile for the active phase compensation circuit. Such a phase compensation circuit is shown to have very little AMAM distortion, thereby resulting in a desirable solution with a flat AMAM, a flat AMPM, and high PAE.

Figures 32, 33, 34:
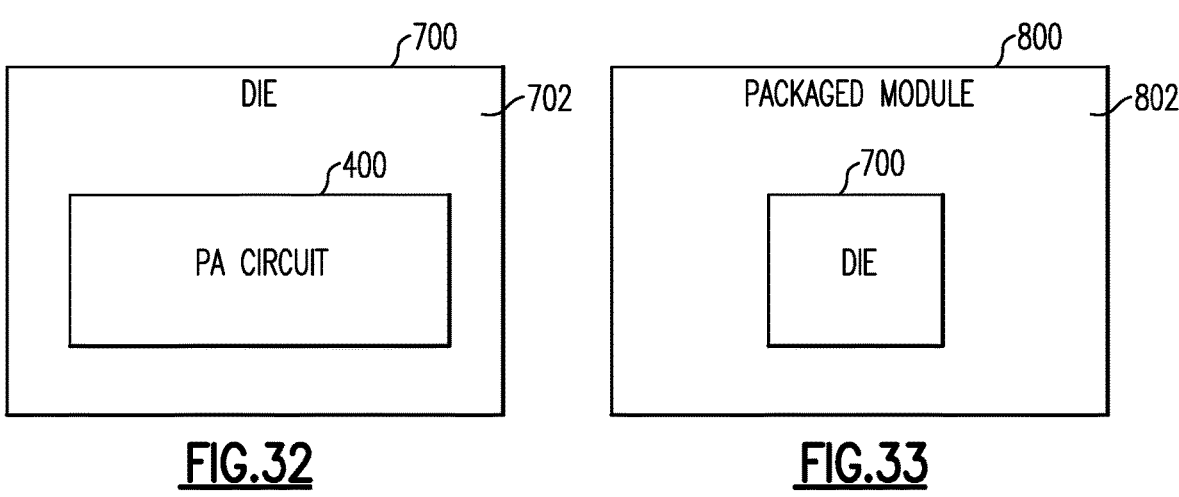
FIG. 32 shows that in some embodiments, a semiconductor die can include a power amplifier system having one or more features as described herein.
FIG. 33 shows that in some embodiments, one or more features as described herein can be implemented in a packaged module.
FIG. 34 depicts an example wireless device having one or more advantageous features described herein.

FIG. 32 shows that in some embodiments, a semiconductor die 700 can include a power amplifier system 400 having one or more features as described herein. Such a power amplifier system can be implemented on a semiconductor substrate 702.

FIG. 33 shows that in some embodiments, one or more features as described herein can be implemented in a packaged module 800. Such a packaged module can include a packaging substrate 802 configured to receive a plurality of components. At least some of the components mounted on the packaging substrate 802 can include a die such as the die 700 of FIG. 32.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 34 depicts an example wireless device 900 having one or more advantageous features described herein. In some embodiments, one or more power amplifier circuits 400 can be configured as described herein. In some embodiments, such one or more power amplifier circuits can be implemented on a power amplifier module 916.

In the example wireless device 900, the power amplifier (PA) module 916 having a plurality of PAs can provide one or more amplified RF signals to the switch 920 (via an assembly of one or more duplexers 918), and the switch 920 can route the amplified RF signal(s) to one or more antennas. In some embodiments, the PAs in the module 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 34, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A power amplifier circuit comprising:
   a power amplifier having an input node and an output node;

a load modulation circuit coupled to the output node of the power amplifier;

a control profile configured to provide information for generating a control signal for the load modulation circuit; and a control circuit configured to generate and provide the control signal to the load modulation circuit based on the control profile, the control signal being generated based on a first current representative of a tunable reference current and a second current representative of a saturation detection current.

2. The power amplifier circuit of claim 1 wherein the first current includes an AMAM current.

3. The power amplifier circuit of claim 1 further comprising a phase compensation circuit implemented in the input node side of the power amplifier.

4. The power amplifier circuit of claim 3 wherein the control profile is further configured to provide information for generating a control signal for the phase compensation circuit.

5. The power amplifier circuit of claim 3 wherein the control signal for the phase compensation circuit is based on a third current representative of a tunable reference current and the second current.

6. The power amplifier circuit of claim 5 wherein the third current includes an AMPM current.

7. A power amplifier circuit comprising:

a power amplifier having an input node and an output node;

a load modulation circuit coupled to the output node of the power amplifier;

a control profile configured to provide information for generating a control signal for the load modulation circuit; and a control circuit configured to generate and provide the control signal to the load modulation circuit based on the control profile, the load modulation circuit being configured to provide variable capacitance that depends on a control voltage representative of the control signal, such that the information provided by the control profile includes an optimized load at a minimum capacitance of the variable capacitance and an optimized load at a maximum capacitance of the variable capacitance.

8. The power amplifier circuit of claim 7 wherein the information provided by the control profile further includes an optimized bias configuration for the power amplifier.

9. The power amplifier circuit of claim 8 wherein the information provided by the control profile further includes an AMAM control profile for the generation of the control signal.

10. The power amplifier circuit of claim 9 wherein the information provided by the control profile further includes a phase compensation profile for generation of a control signal for a phase compensation circuit.

11. The power amplifier circuit of claim 10 wherein the information provided by the control profile further includes average power tracking performance information based on implementation of the control signal for the phase compensation circuit.

12. The power amplifier circuit of claim 1 wherein the power amplifier includes an input stage and an output stage.

13. The power amplifier of claim 12 wherein the input stage is implemented as a driver stage, and the output stage is implemented as a final stage.

14. The power amplifier circuit of claim 13 wherein the driver stage is implemented as a cascode driver stage.

15. The power amplifier circuit of claim 13 wherein the final stage is implemented as a push-pull amplifier.

16. The power amplifier of claim 15 wherein the push-pull amplifier includes a splitter having an input and a pair of outputs, each output coupled to an input of a respective amplifier, the push-pull amplifier further including a combining circuit that combines outputs of the pair of amplifiers.

17. The power amplifier of claim 16 wherein the combining circuit includes a transformer circuit having a primary with first and second nodes coupled to the outputs of the pair of amplifiers, and a secondary with first and second nodes, the first node coupled to an output node and the second node coupled to ground through the load modulator.

18. A wireless device comprising:

an antenna; and an amplifier circuit configured to amplify a radio-frequency signal associated with the antenna, the amplifier circuit including an amplifier, a load modulation circuit coupled to an output node of the amplifier, and a control profile configured to provide information for generating a control signal for the load modulation circuit, the amplifier circuit further including a control circuit configured to generate and provide the control signal to the load modulation circuit based on the control profile, the control signal being generated based on a first current representative of a tunable reference current and a second current representative of a saturation detection current.

* * * * *